United States Patent
Kiuchi et al.

(10) Patent No.: US 6,392,003 B1
(45) Date of Patent: May 21, 2002

(54) PHENOL CONDENSATE FROM PHENOLS, AROMATIC COMPOUND AND N-CONTAINING HETEROCYCLIC

(75) Inventors: Yukihiro Kiuchi; Masatoshi Iji; Makoto Soyama, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/461,197

(22) Filed: Dec. 15, 1999

(30) Foreign Application Priority Data

| Dec. 15, 1998 | (JP) | ............................................. 10-356165 |
| Apr. 7, 1999 | (JP) | ............................................. 11-100186 |
| Nov. 19, 1999 | (JP) | ............................................. 11-329693 |

(51) Int. Cl.$^7$ .......................... B32B 27/38; B32B 27/42; C08G 8/20; C08G 12/32
(52) U.S. Cl. ........................ 528/163; 428/524; 428/901; 525/109; 525/138; 525/428; 525/442; 525/481; 525/502; 525/504
(58) Field of Search ................................. 525/504, 109, 525/138, 481, 502, 428, 442; 528/162, 163; 428/524, 901

(56) References Cited

U.S. PATENT DOCUMENTS 4,340,700 A * 7/1982 Edwards ...................... 525/503
5,612,442 A   3/1997 Okazaki et al. ............. 528/212
5,939,515 A * 8/1999 Guenther et al. ........... 528/254

FOREIGN PATENT DOCUMENTS

| EP | 0 716 111 | 6/1996 |
| EP | 0 795 570 | 9/1997 |
| EP | 0 877 040 | 11/1998 |
| JP | 61-311142 A | * 10/1986 |
| JP | 8-311142 A | * 11/1996 |

* cited by examiner

*Primary Examiner*—Robert E. L. Sellers
(74) *Attorney, Agent, or Firm*—Young & Thompson

(57) ABSTRACT

The present invention provides a flame retardant phenol resin material which includes a phenol condensate, wherein a poly-aromatic compound obtained by a reaction of phenols (A) to aromatics (B) except for phenols and a heterocyclic compound (C) including nitrogen as heteroatom are condensed via aldehydes (D), and also provides a flame retardant epoxy resin material which includes an epoxy resin obtained by glycidyl-etherification of at least a part of phenolic hydroxyl groups of a poly-aromatic compound obtained by a reaction of phenols (A) to aromatics (B) except for phenols and a heterocyclic compound (C) including nitrogen as heteroatom are condensed via aldehydes (D).

9 Claims, 1 Drawing Sheet

Foam layer free of nitrogen gases

Foam layer containing nitrogen gases

PHENOL CONDENSATE FROM PHENOLS, AROMATIC COMPOUND AND N-CONTAINING HETEROCYCLIC

BACKGROUND OF THE INVENTION

The present invention relates to a flame retardant resin material and a flame retardant resin composition, and more particularly to a flame retardant resin material and a flame retardant resin composition which are improved in flame retardancy, thermal stability or thermal decomposition resistance, and moisture resistance.

In order to prevent flame, it is required that resin compositions has a flame retardancy. Usually, halogen flame retardants are used as flame retardants whilst antimony trioxide is used as a co-flame retardant co-used along with the flame retardant. The halogen flame retardants generate harmful halogen substances, typically dioxins. The antimony trioxide as the co-flame retardant has a chronic toxicity. For those reasons, the above substances raise a problem in safety in fire or waste disposal. Phosphoric flame retardants such as red phosphorus and ester phosphate are effective to avoid the above problem. Those phosphoric flame retardants provide influences to moisture resistance of the resin compositions. Particularly, insulators for electronic components are required to have a high reliability. Those phosphoric flame retardants are a problem in use for the insulators for electronic components.

On the other hand, epoxy resin compositions are superior in mechanical properties, adhesive property, chemical resistance property, heat resistance and insulating properties, for which reason the epoxy resin compositions are used in various fields in adhesive, coating materials, laminated plates, molding materials and injection materials. In case of the epoxy resin compositions, halogen flame retardants are used as flame retardants whilst antimony trioxide is used as a co-flame retardant. If the flame retardant and the co-flame retardant are used for the epoxy resin composition, problems in not only safety but also corrosion of metals are raised. If those epoxy resin compositions are used as insulators for the electronic components, corrosion resistance to interconnections under high temperature is lowered, whereby reliability of the electronic device is deteriorated. For this reason, it had been required to develop other epoxy resin compositions free from the halogen flame retardant and antimony trioxide.

It was investigated to improve the flame retardancy of the resin material by introducing a triazine ring into a molecular structure of an epoxy resin or a phenol resin. In Japanese laid-open patent publication No. 8-311142, it is disclosed that mixtures of phenols with compounds having triazine rings and with aldehydes or phenol condensates such as phenol triazine resins are used as a hardening agent for the epoxy resin compositions. In Japanese laid-open patent publication No. 10-279657, it is disclosed that a phenol triazine epoxy resin obtained by glycidyl-etherification of the above described phenol triazine resin is used as a main component of the epoxy resin composition.

There is, however, the following problem in introducing the triazine rings into the molecular structures of the epoxy resins and the phenol resins.

The flame retardancy of the resin compositions including the phenol triazine resins and the phenol triazine epoxy resins is exhibited due to a flame reducing mechanism by flame resistant gases which contain, as a main component, nitrogen compounds generated by decomposition of triazines. If in order to emphasize the flame reducing effect, a content of nitrogen in the resin composition is increased, then the resistance to the thermal decomposition of the resin composition is deteriorated, whereby the flame retardancy is thus deteriorated. Since triazines have hydrophilicity, the increase in content of the triazines (nitrogen) in the resin composition causes a remarkable reduction in moisture resistance.

Consequently, it is difficult to further improve the flame retardancy of the resin composition by introducing nitrogen compounds into the molecular structure of the resin composition.

In the above circumstances, it had been required to develop a novel flame retardant resin material and a novel flame retardant resin composition free from the above problems.

SUMMARY OF THE INVENTION

Accordingly, it is an object of the present invention to provide a novel flame retardant resin material free from the above problems.

It is a further object of the present invention to provide a novel flame retardant resin material having a high frame retardancy.

It is a still further object of the present invention to provide a novel flame retardant resin material having a high thermal stability or a high thermal decomposition resistance.

It is yet a further object of the present invention to provide a novel flame retardant resin material having a high moisture resistance.

It is further more of the present invention to provide a novel flame retardant resin composition free from the above problems.

It is moreover object of the present invention to provide a novel flame retardant resin composition having a high frame retardancy.

It is another object of the present invention to provide a novel flame retardant resin composition having a high thermal stability or a high thermal decomposition resistance.

It is still another object of the present invention to provide a novel flame retardant resin composition having a high moisture resistance.

The present invention provides a flame retardant phenol resin material which includes a phenol condensate, wherein a poly-aromatic compound obtained by a reaction of phenols (A) to aromatics (B) except for phenols and a heterocyclic compound (C) including nitrogen as heteroatom are condensed via aldehydes (D).

The present invention also provides a flame retardant epoxy resin material which includes an epoxy resin obtained by glycidyl-etherification of at least a part of phenolic hydroxyl groups of a poly-aromatic compound obtained by a reaction of phenols (A) to aromatics (B) except for phenols and a heterocyclic compound (C) including nitrogen as heteroatom are condensed via aldehydes (D).

The present invention also provides a flame retardant resin composition including a flame retardant phenol resin material which includes a phenol condensate, wherein a poly-aromatic compound obtained by a reaction of phenols (A) to aromatics (B) except for phenols and a heterocyclic compound (C) including nitrogen as heteroatom are condensed via aldehydes (D).

The present invention also provides a flame retardant resin composition including a flame retardant epoxy resin material which includes an epoxy resin obtained by glycidyl-etherification of at least a part of phenolic hydroxyl groups of a poly-aromatic compound obtained by a reaction of phenols (A) to aromatics (B) except for phenols and a heterocyclic compound (C) including nitrogen as heteroatom are condensed via aldehydes (D).

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
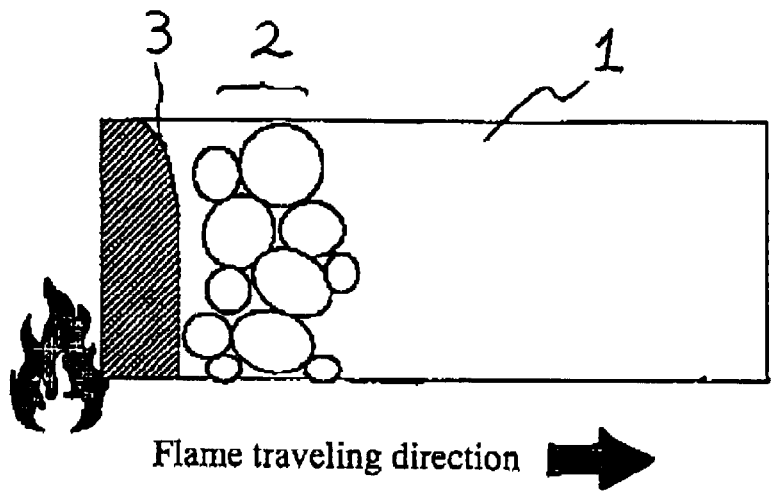
FIG. 1A is a schematic view illustrative of a flame retardant mechanism of a flame retardant resin composition having a foam layer free of nitrogen based frame reducing gas.

The first present invention provides a flame retardant phenol resin material which includes a phenol condensate, wherein a poly-aromatic compound obtained by a condensation reaction of phenols (A) to aromatics (B) except for phenols and a heterocyclic compound (C) including nitrogen as heteroatom are condensed via aldehydes (D).

It is preferable that the aromatics (B) are represented by the following chemical formula (1),

$$XH_2C-R_1-CH_2X \qquad (1)$$

where $R_1$ is any one of biphenyl derivatives, phenylene derivatives, naphthalene derivatives, biphenylene derivatives, fluorene derivatives, bis-phenol fluorene derivatives, and X is any one of halogen atoms, hydroxyl groups and alkoxyl groups having not larger than 10 carbon atoms.

It is further preferable that the $R_1$ is any one of biphenyl derivatives and phenylene derivatives.

It is also preferable that the heterocyclic compound (C) is triazines.

It is further preferable that the triazines include compounds having at least one amino group.

It is also preferable that the triazines are at least one compound selected from the groups consisting of melamine, acetoguanamine and benzoguanamine.

The second present invention provides a flame retardant resin composition which includes at least a flame retardant phenol resin material of the first present invention.

It is preferable to further include an aromatic thermosetting resin having aromatic rings on a main chain skeleton.

It is further preferable that the aromatic thermosetting resin comprises an epoxy resin having a novolak structure.

It is also preferable that the aromatic thermosetting resin comprises a phenol resin having a novolak structure.

It is also preferable that the aromatic thermosetting resin comprises a phenol aralkyl epoxy resin having aromatic rings on a novolak-structured main chain.

It is further preferable that the phenol aralkyl epoxy resin has at least any one of biphenyl derivatives and phenylene derivatives on the novolak-structured main chain.

It is also preferable that the aromatic thermosetting resin comprises a phenol aralkyl phenol resin having aromatic rings on a novolak-structured main chain.

It is further preferable that the phenol aralkyl phenol resin has at least any one of biphenyl derivatives and phenylene derivatives on the novolak-structured main chain.

It is also preferable to further include an aromatic thermoplastic resin having aromatic rings on a main chain skeleton.

The third present invention provides a semiconductor device having a sealing resin which comprises a flame retardant resin composition of the second present invention.

The fourth present invention provides a printed wiring board having an insulator which comprises a flame retardant resin composition of the second present invention.

The fifth present invention provides a molding material comprising a flame retardant resin composition of the second present invention.

The sixth present invention provides a flame retardant epoxy resin material which includes an epoxy resin obtained by glycidyl-etherification of at least a part of phenolic hydroxyl groups of a poly-aromatic compound obtained by a condensation reaction of phenols (A) to aromatics (B) except for phenols and a heterocyclic compound (C) including nitrogen as heteroatom via aldehydes (D).

It is preferable that the aromatics (B) are represented by the following chemical formula (1),

$$XH_2C-R_1-CH_2X \qquad (1)$$

where $R_1$ is any one of biphenyl derivatives, phenylene derivatives, naphthalene derivatives, biphenylene derivatives, fluorene derivatives, bis-phenol fluorene derivatives, and X is any one of halogen atoms, hydroxyl groups and alkoxyl groups having not larger than 10 carbon atoms.

It is further preferable that the $R_1$ is any one of biphenyl derivatives and phenylene derivatives.

It is also preferable that the heterocyclic compound (C) is triazines.

It is further preferable that the triazines include compounds having at least one amino group.

It is also preferable that the triazines are at least one compound selected from the groups consisting of melamine, acetoguanamine and benzoguanamine.

The seventh present invention provides a flame retardant resin composition which includes at least a flame retardant epoxy resin material of the sixth present invention.

It is preferable to further include an aromatic thermosetting resin having aromatic rings on a main chain skeleton.

It is further preferable that the aromatic thermosetting resin comprises an epoxy resin having a novolak structure.

It is also preferable that the aromatic thermosetting resin comprises a phenol resin having a novolak structure.

It is also preferable that the aromatic thermosetting resin comprises a phenol aralkyl epoxy resin having aromatic rings on a novolak-structured main chain.

It is further preferable that the phenol aralkyl epoxy resin has at least any one of biphenyl derivatives and phenylene derivatives on the novolak-structured main chain.

It is also preferable that the aromatic thermosetting resin comprises a phenol aralkyl phenol resin having aromatic rings on a novolak-structured main chain.

It is further preferable that the phenol aralkyl phenol resin has at least any one of biphenyl derivatives and phenylene derivatives on the novolak-structured main chain.

It is also preferable to further include an aromatic thermoplastic resin having aromatic rings on a main chain skeleton.

The eighth present invention provides a semiconductor device having a sealing resin which comprises a flame retardant resin composition of the seventh present invention.

The ninth present invention provides a printed wiring board having an insulator which comprises a flame retardant resin composition of the seventh present invention.

The tenth present invention provides a molding material comprising a flame retardant resin composition of the seventh present invention.

Accordingly, the present invention provides a flame retardant phenol resin material which includes a phenol condensate, wherein a poly-aromatic compound obtained by a reaction of phenols (A) to aromatics (B) except for phenols and a heterocyclic compound (C) including nitrogen as heteroatom are condensed via aldehydes (D).

The present invention also provides a flame retardant epoxy resin material which includes an epoxy resin obtained by glycidyl-etherification of at least a part of phenolic hydroxyl groups of a poly-aromatic compound obtained by a reaction of phenols (A) to aromatics (B) except for phenols and a heterocyclic compound (C) including nitrogen as heteroatom are condensed via aldehydes (D).

The present invention also provides a flame retardant resin composition including a flame retardant phenol resin material which includes a phenol condensate, wherein a poly-aromatic compound obtained by a reaction of phenols (A) to aromatics (B) except for phenols and a heterocyclic compound (C) including nitrogen as heteroatom are condensed via aldehydes (D).

The present invention also provides a flame retardant resin composition including a flame retardant epoxy resin material which includes an epoxy resin obtained by glycidyl-etherification of at least a part of phenolic hydroxyl groups of a poly-aromatic compound obtained by a reaction of phenols (A) to aromatics (B) except for phenols and a heterocyclic compound (C) including nitrogen as heteroatom are condensed via aldehydes (D).

The above flame retardant resin compositions may include an aromatic thermosetting resin having an aromatic ring in a main chain skeleton.

The above flame retardant resin compositions may include an aromatic thermoplastic resin having an aromatic ring in a main chain skeleton.

The present invention also provides a semiconductor device using a sealing resin which comprises the above flame retardant resin composition.

The present invention also provides an electronic or electric component having a semiconductor device using a sealing resin which comprises the above flame retardant resin composition.

The present invention also provides a printed wiring board using an insulator material which comprises the above flame retardant resin composition.

The present invention also provides a molding material comprising a flame retardant thermosetting resin which comprises the above flame retardant resin composition.

The present invention also provides a molding material comprising a flame retardant thermoplastic resin which comprises the above flame retardant resin composition.

In this specification, "flame retardant phenol resin material" is defined to be a phenol resin material, wherein a phenol condensate having the above structure is optionally mixed with other phenol resins. "flame retardant epoxy resin material" is defined to be an epoxy resin material, wherein an epoxy resin having the above structure is optionally mixed with other epoxy resins, "frame retardant resin composition" includes the above flame retardant phenol resin materials and/or the above flame retardant epoxy resin materials which may optionally be mixed with fillers, flame retardants such as metal hydroxides, phosphoric compounds except for halogen compounds or other additives.

The flame retardant phenol resin materials and the flame retardant epoxy resin materials in accordance with the present invention will hereinafter be referred to as "flame retardant resin materials". The flame retardant resin material has the aromatics (B) and the heterocyclic compound (C) in its condensate, for which reason the flame retardant resin material is superior in flame retardancy as compared to the conventional flame retardant resin materials.

If, in accordance with the prior art, the flame retardant resin material having molecular skeletons introduced with the heterocyclic compound (C) including nitrogen atoms as the heteroatom therein is added into the resin composition, then nitrogen based flame resistant gases are generated by ignition, whereby the flame resistant gases are dispersed to an atmosphere and an insufficient flame retarding effect is obtained. It is necessary for obtaining a sufficient flame retarding effect to generate a large amount of the nitrogen based flame resistant gases. The source of the nitrogen based flame resistant gases is triazine ring. If the content of the triazine rings in the resin composition is increased, then the thermal stability or the resistance to the thermal decomposition is deteriorated, whereby the flame retardancy is deteriorated and the moisture resistance and other properties are also deteriorated.

In accordance with the present invention, the flame retardant resin material having both the aromatics (B) and the heterocyclic compound (C) in the condensate is added to the resin composition to exhibit a novel flame retarding mechanism different from the conventional technique.

The novel flame retarding mechanism will hereinafter be described by taking an example of a thermosetting resin including the flame retardant resin material.

The flame retardant resin material in accordance with the present invention includes aromatics (B). The flame retardant resin composition including the flame retardant resin material is low in bridge density in thermosetting resin composition, for which reason decomposition gases generated by ignition of the resin composition expends a surface of the resin composition to form a foam layer. The addition of the above flame retardant resin composition causes this foam layer to include phenols superior in thermal stability or thermal decomposition resistance and aromatic derivatives or poly-aromatics, whereby the resin composition has a high hot strength which suppress foam-breaking. Oxygen or heat are shielded by this foam layer, whereby a high flame retarding effect can be obtained.

Figure 1B:
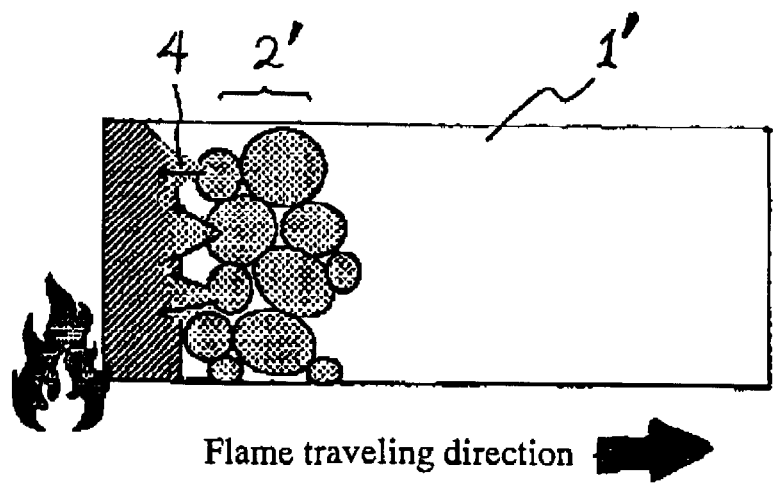
FIG. 1B is a schematic view illustrative of a flame retardant mechanism of a flame retardant resin composition having a foam layer filled with nitrogen based frame reducing gas.

In addition to the aromatics (B), the heterocyclic compound (C) is introduced into the molecular skeletons of the flame retardant resin composition in order to not only prevent the spreading fire but also cause the foam layer to reduce the fire for obtaining a higher flame retardancy. Namely, the flame retardant resin composition in accordance with the present invention includes the heterocyclic compound (C). The nitrogen based flame resistant gases are generated in ignition. A part of the generated gases is diffused into the atmosphere whilst the remaining part thereof fills the foam layer. The foam layer filled with the nitrogen based flame resistant gases not only prevents the spreading fire but also reducing the fire. This mechanism will be described with reference to the drawing. FIG. 1A is a schematic view illustrative of a flame retardant mechanism of a flame retardant resin composition having a foam layer free of nitrogen based frame reducing gas. A left side edge of a resin product 1 is burned or fired and a fire face 3 is made spread toward a foam layer 2 which prevents the fire spread. If the fire face 3 is made close to the foam layer 2, some of forms are broken, whereby it is no longer possible to prevent the fire spread. FIG. 1B is a schematic view illustrative of a flame retardant mechanism of a flame retardant resin composition having a foam layer filled with nitrogen based frame reducing gas. A left side edge of a resin product 1' is burned or fired and a fire face 3' is made spread toward a foam layer 2 which reduces the fire. If the fire face 3 is made close to the foam layer 2, some of forms are broken, whereby the nitrogen based gases 4 are injected to the fire, and the fire is reduced by the nitrogen based gases. Namely, the foam layer 2' serves as a reservoir layer for reserving the nitrogen based flame reducing gases 4' which are capable of fire extinction. The thermosetting resin composition including the flame retardant resin material exhibits the higher flame retardancy than that of the conventional resin composition. It is also possible to cause a high multiplier effect in flame retardancy by the flame retardant resin material to a resin composition having a base material of an aromatic thermosetting resin having aromatic rings on the main chain skeleton, for example, an epoxy resin containing a novolak structure and/or an epoxy resin composition having a base material of an epoxy resin containing a novolak structure, particularly a phenol aralkyl type epoxy resin having aromatic rings on a novolak-structured main chain skeleton and/or a phenol aralkyl type phenol resin having aromatic rings on a novolak-structured main chain skeleton. The aromatic thermosetting resin having the aromatic rings on the main chain skeleton is high in thermal stability and shows a high compatibility with the flame retardant resin material, whereby a uniform and stable foam layer can be obtained in ignition. Particularly, an extremely stable foam layer can be obtained by using an epoxy resin containing a novolak structure and/or an epoxy resin composition having a base material of an epoxy resin containing a novolak structure, particularly a phenol aralkyl type epoxy resin having aromatic rings on a novolak-structured main chain skeleton and/or a phenol aralkyl type phenol resin having aromatic rings on a novolak-structured main chain skeleton.

The flame retardant resin material in accordance with the present invention has both the aromatics (B) and the heterocyclic compound (C) in the same condensate so that the resin composition containing the flame retardant resin material has a high flame retardancy and a high moisture resistance. If, differently from the present invention, the resin composition having a molecular skeleton introduced with the aromatics (B) and a different molecular skeleton introduced with the heterocyclic compound (C) does not have both a high flame retardancy and a high moisture resistance. For example, a resin composition having a phenol biphenyl aralkyl epoxy resin having a biphenyl group on the molecular skeleton and a phenol resin having triazine rings does not have a sufficiently high flame retardancy and moisture resistance. The high flame retardancy and the high moisture resistance shown by the flame retardant resin material of the present invention can be obtained by introducing the aromatics (B) which are superior in both the thermal stability or resistance to the thermal decomposition and the hydrophobicity. Addition of the resin composition with the flame retardant resin material having the aromatics (B) and the heterocyclic compound (C) in the same condensate in accordance with the present invention results in improvements in both the flame retardancy and the moisture resistance.

The above descriptions about the flame retardancy mechanism of the flame retardant resin material have been made by taking, as one example, the thermosetting resin composition. The above novel flame retardant resin material is, of course, applicable to thermoplastic resin composition to obtain such the high flame retardancy. Similarly to the above described thermosetting resin composition, the thermoplastic resin composition containing the flame retardant resin material of the present invention causes a foam layer to be formed in ignition, wherein the foam layer is superior in thermal stability or resistance to the thermal decomposition, whereby the thermoplastic resin composition exhibits a high flame retardancy. The thermoplastic resin composition containing the flame retardant resin material having both the aromatics (B) and the heterocyclic compound (C) in the same condensate provides the large effects. The combination of the aromatics in the flame retardant resin material is compatible with the aromatic rings, for which reason the aromatic thermoplastic resin composition having the aromatic rings on the main chain skeleton is preferable in view of improvement in the flame retardancy.

In accordance with the present invention, phenols (A) are not limited provided that an aromatic compound having a hydroxyl group. For example, there are available as the phenols (A) phenol, naphthols such as α-naphthol and β-naphthol, bisphenol fluorene type phenol, alkyl phenols such as cresol, xylenol, ethyl phenol, butyl phenol, nonyl phenol, and octyl phenol, polyhydric phenols such as bis-phenol A, bis-phenol F, bis-phenol S, resorcin and catechol, phenyl phenol, and amino phenol. Those phenols may be used alone or in combination.

In accordance with the present invention, the aromatics (B) comprises one or more aromatic compounds except for the above described phenols (A). The aromatics (B) are not limited provided that the aromatics (B) are chemically reacted and bonded with the phenols (A). It is preferable that the aromatics (B) are represented by the following chemical formula (1).

$$XH_2C-R_1-CH_2X \qquad (1)$$

where $R_1$ is any one of biphenyl derivatives, phenylene derivatives, naphthalene derivatives, biphenylene derivatives, fluorene derivatives, bis-phenol fluorene derivatives, and anthracene derivatives, and X is any one of halogen atoms, hydroxyl groups and alkoxyl groups having not larger than 10 carbon atoms.

The biphenyl derivatives means a divalent group derived from substitutional or unsubstitutional biphenyl. The substitutional biphenyl may be, for example, hydrocarbon groups having a chain-structure including unsaturated bonds of 1–6 carbon atoms such as allyl groups, and alkyl groups of 1–6 carbon atoms.

The phenylene derivatives means a divalent group derived from substitutional or unsubstitutional phenylene. The substitutional phenylene may be, for example, hydrocarbon groups having a chain-structure including unsaturated bonds of 1–6 carbon atoms such as allyl groups, and alkyl groups of 1–6 carbon atoms. The phenylene derivatives include divalent groups derived from diphenyl ether, divalent groups derived from bis-phenol A, divalent groups derived from bis-phenol F, and divalent groups derived from bis-phenol S.

The naphthalene derivatives means a divalent group derived from substitutional or unsubstitutional naphthalene. The substitutional naphthalene may be, for example, hydrocarbon groups having a chain-structure including unsaturated bonds of 1–6 carbon atoms such as allyl groups, and alkyl groups of 1–6 carbon atoms.

The biphenylene derivatives means a divalent group derived from substitutional or unsubstitutional biphenylene. The substitutional biphenylene may be, for example, hydrocarbon groups having a chain-structure including unsaturated bonds of 1–6 carbon atoms such as allyl groups, and alkyl groups of 1–6 carbon atoms.

The fluorene derivatives means a divalent group derived from substitutional or unsubstitutional fluorene. The substitutional fluorene may be, for example, hydrocarbon groups having a chain-structure including unsaturated bonds of 1–6 carbon atoms such as allyl groups, and alkyl groups of 1–6 carbon atoms.

The bis-phenol fluorene derivatives means a divalent group derived from substitutional or unsubstitutional bis-phenol fluorene. The substitutional bis-phenol fluorene may be, for example, hydrocarbon groups having a chain-structure including unsaturated bonds of 1–6 carbon atoms such as allyl groups, and alkyl groups of 1–6 carbon atoms.

The anthracene derivatives means a divalent group derived from substitutional or unsubstitutional anthracene. The substitutional anthracene may be, for example, hydrocarbon groups having a chain-structure including unsaturated bonds of 1–6 carbon atoms such as allyl groups, and alkyl groups of 1–6 carbon atoms.

It is preferable that $R_1$ is any one of biphenyl derivatives, phenylene derivatives, whereby a thermosetting resin composition having a low bridge density can be obtained. A foam layer in a form of rubber which is superior in thermal decomposition resistance is formed in ignition. Biphenyl and derivatives thereof as well as phenylene and derivatives thereof are superior in hydrophobicity, for which reason introduction of them causes a great improvement in moisture resistance of the resin composition.

The aromatics (B) are not limited provided that the aromatics (B) are chemically reacted and bonded with the phenols (A). The aromatics (B) may be a compound represented by the following general formula (1).

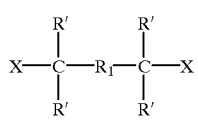

general formula (1)

where a hydrogen atom bonded to a carbon atom of methylene chain (—CH$_2$—) is substituted with other substituent (R'). This substituent (R') may be, for example, a hydrocarbon group having 1–10 carbon atoms and/or an alkoxyl group having 1–10 carbon atoms as well as polymers based on other hydrocarbons.

In accordance with the present invention, heterocyclic compound (C) including nitrogen as heteroatom serves as a source of flame reducing gas. The heterocyclic compound (C) includes one or more nitrogen atoms, and optionally may further include other atoms such as sulfur as heteroatom. It is particularly preferable that the heterocyclic compound (C) including nitrogen as heteroatom is triazines. The triazines means compounds having one or more triazine rings to effectively discharge flame reducing nitrogen based gases.

It is preferable that the triazines have at least one amino group so that the triazines and the poly-aromatics obtained by reaction of the phenols (A) with the aromatics (B) except for phenols may easily condensed via the aldehydes (D).

It is preferable that the triazines are represented by the following general formulae (2) and (3) so as to effectively discharge flame reducing nitrogen based gases.

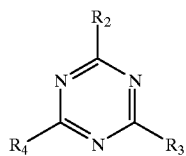

general formula (2)

where each of $R_2$, $R_3$, and $R_4$ is any one of amino groups, phenyl groups, alkyl groups having 1–12 carbon atoms, hydroxyl groups, hydroxyl alkyl groups, ether groups, ester groups, carboxyl groups, unsaturated hydrocarbon groups, cyano groups, thiol groups, halogen atoms. It is preferable that if $R_2$, $R_3$, and $R_4$ are substituted with alkyl groups, the number of alkyl groups in the formula is not more than 2 and others are the above reactive functional groups.

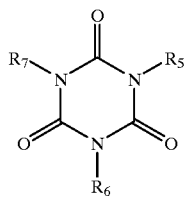

general formula (3)

where each of $R_5$, $R_6$, and $R_7$ is any one of hydrogen atom, alkyl groups having 1–12 carbon atoms, phenyl groups, hydroxyl groups, hydroxyl alkyl groups, ester groups, carboxyl groups, unsaturated hydrocarbon groups, cyano groups, halogen atoms. It is preferable that if $R_5$, $R_6$, and $R_7$ are substituted with alkyl groups, the number of alkyl groups in the formula is not more than 2 and others are the above reactive functional groups.

As described above, it is preferable that at least one of $R_2$, $R_3$, and $R_4$ is amino groups. The compounds represented by the general formula (2) may be, for example, the triazine derivatives such as benzoguanamine, acetoguanamine and melamine, cyanuric acid derivatives such as cyanuric acid, trimethyl cyanurate, triethyl cyanurate, triacetyl cyanurate, cyanuric chloride. It is more preferable that the triazine derivative is benzoguanamine (the following general formula (4)), acetoguanamine (the following general formula (5)), melamine (the following general formula (6)). Benzoguanamine is most preferable because this compound makes the heterocyclic compound (C) easy to be compatible with the poly-aromatics obtained by the reaction of the phenols (A) with the aromatics (B) except for phenols and with the aldehydes (D), resulting in an efficient reaction and improvement in moisture resistance of the flame retardant resin material.

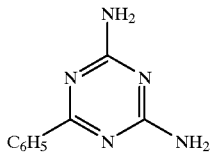

general formula (4)

general formula (5)

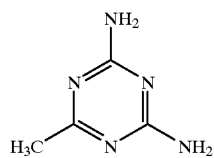

general formula (6)

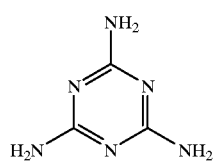

It is also preferable that at least one of is $R_5$, $R_6$, and $R_7$ is hydrogen atom. The compounds represented by the general formula (3) may be, for example, isocyanuric acid derivatives such as isocyanuric acid, trimethyl isocyanurate, triethyl isocyanurate, triallyl isocyanurate, tris-(2-hydroxyethyl) isocyanurate, tris-(2-carboxylethyl) isocyanurate, isocyanuric chloride. It is most preferable that all of $R_5$, $R_6$, and $R_7$ are hydrogen atoms. The cyanuric acid represented in the general formula (2) as tautomer of those compounds is also preferable.

The compounds of the general formulae (2) and (3) may be used alone or in combination.

In accordance with the present invention, the aldehydes (D) are not limited but formaldehyde is preferable as being convenient in use. Typical sources are, for example, formalin and paraformaldehyde.

The flame retardant phenol resin material of the present invention includes a phenol condensate in which the components (A), (B), (C) and (D) are condensed. The flame retardant epoxy resin material of the present invention includes an epoxy resin, wherein the phenol condensate is glycidyl-etherificated.

It is preferable that an epoxy resin is contained in the flame retardant phenol resin material of the present invention to obtain a resin composition superior in flame retardancy, mixing stability, thermal stability and moisture resistance and other properties, wherein the phenol condensate of the present invention serves as a thermosetting agent for the epoxy resin composition.

Similarly, it is also preferable that a thermosetting agent for epoxy resin is included in the flame retardant epoxy resin material of the present invention to obtain a resin composition superior in flame retardancy, mixing stability, thermal stability and moisture resistance and other properties.

The flame retardant resin material of the present invention is particularly effective for flame retardation of the epoxy resin composition. The epoxy resin and the epoxy resin thermosetting agent serve as the base materials of the epoxy resin composition including the flame retardant resin material of the present invention. As the epoxy resin and the epoxy resin thermosetting agent, an epoxy resin containing a novolak structure and a phenol resin containing a novolak structure are preferable. Particularly, a phenol aralkyl type epoxy resin having aromatic rings on the novolak-structured main chain skeleton and a phenol aralkyl type phenol resin having aromatic rings on the novolak-structured main chain skeleton are further preferable. As the phenol aralkyl type epoxy resin and the phenol aralkyl type phenol resin, there is used for the base material of the epoxy resin, at least any one of phenolbiphenylaralkyl epoxy resin, phenolbiphenylaralkyl phenol resin, phenolphenylenearalkyl epoxy resin, phenolphenylenearalkyl phenol resin, phenoldiphenylaralkyl epoxy resin, phenoldiphenylaralkyl phenol resin, naphtholaralkyl epoxy resin, naphtholaralkyl phenol resin, phenolanthracenearalkyl epoxy resin, and phenolanthracenearalkyl phenol resin.

The co-use of the flame retardant resin material of the present invention along with epoxy resin and/or the thermosetting material for the epoxy resin is effective to provide a suitable resin composition for a sealing resin of semiconductor device and insulator for printed board.

The flame retardant resin material of the present invention is also effective for flame retardation of other resin compositions than the epoxy resin composition. Particularly, the flame retardant resin material of the present invention may be well compatible and uniformly dispersed. The flame retardant resin material of the present invention is effective for the aromatic thermosetting resins having the aromatic rings on the main chain skeleton, for example, phenol resins and resin compositions having polyester as the base material and for the aromatic thermoplastic resins having the aromatic rings on the main chain skeleton, for example, polycarbonate, polystyrene, co-polymer (AB) of acrylonitrile and styrene, co-polymer (ABS) of acrylonitrile, butadiene and styrene, polyphenylene ether, polybutylene terephthalate, nylon, and resin compositions having a base material of polymer alloy comprising at least two of them. The flame retardant resin material of the present invention is also effective for resin compositions having a base material of olefins, and optionally together with dispersing agent for obtaining a higher flame retardancy.

The flame retardant phenol resin material of the present invention uses the specific-structured condensate which includes the above components (A), (B), (C) and (D) in one molecule, for which reason there is no limitation to molecular weight. As the phenol condensate, plural types of the substances different in molecular weight may be included in the condensate.

The flame retardant epoxy resin material of the present invention also uses the specific-structured condensate which includes the above components (A), (B), (C) and (D) in one molecule, for which reason there is no limitation to molecular weight. As the epoxy resin, plural types of the substances different in molecular weight may be included in the condensate.

The flame retardant resin composition of the present invention may include any one of the flame retardant phenol resin material and the flame retardant epoxy resin material or include the both. The flame retardant resin composition of the present invention may further preferably include the aromatic thermosetting resin having aromatic rings on the main chain skeleton or the aromatic thermoplastic resin having aromatic rings on the main chain skeleton. It is particularly preferable that the flame retardant resin composition of the present invention may further include the above aromatic thermosetting resin. Those resins have good compatibility with the flame retardant resin material of the present invention, for which reason a uniform and extremely stable foam layer can be obtained in ignition to cause a remarkable flame retardancy. Particularly, if the above aromatic thermosetting resin comprises an epoxy resin containing a novolak structure and/or a phenol resin containing a novolak structure, for example, if the above aromatic thermosetting resin comprises a phenol aralkyl type epoxy resin having aromatic rings on a novolak-structured main chain skeleton and/or a phenol aralkyl type phenol resin having aromatic rings on a novolak-structured main chain skeleton, then more remarkable effect of flame retardation can be obtained. It is preferable that the above phenol aralkyl type epoxy resin includes biphenyl derivatives and/or phenylene derivatives on the main chain skeleton. It is preferable that those aromatic thermosetting resins are used as the base material in the resin composition, to cause a multiplier effect in the flame retardation.

A typical method of preparing the phenol condensate in accordance with the present invention will be described even other methods may be available.

The phenols (A) are reacted with the aromatics (B) under an acidic catalyst to cause a condensation reaction to form a condensate represented by the following general formula (7). The above condensation reaction is made under the conditions that a molar ratio of the phenols (A) to the aromatics (B) is ranged from 0.3:1 to 20:1, preferably from 0.4:1 to 15:1.

general formula (7)

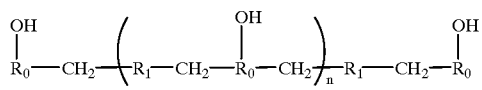

where "n" is 0.0 to 10, preferably 0.0 to 3.0, and more preferably 0.0 to 1.0, $R_0$—OH is any one of phenol derivatives, naphthol derivatives, derivatives of poly-phenol such as bis-phenol fluorene derivatives, bis-phenol A, bis-phenol F, bis-phenol S, resorcin, and catechol, and derivatives of alkyl phenols.

$R_1$ is any one of biphenyl derivatives, phenylene derivatives, naphthalene derivatives, biphenylene derivatives, fluorene derivatives, bis-phenol fluorene derivatives, and anthracene derivatives.

The biphenyl derivatives means a divalent group derived from substitutional or unsubstitutional biphenyl. The substitutional biphenyl may be, for example, hydrocarbon groups having a chain-structure including unsaturated bonds of 1–6 carbon atoms such as allyl groups, and alkyl groups of 1–6 carbon atoms.

The phenylene derivatives means a divalent group derived from substitutional or unsubstitutional phenylene. The substitutional phenylene may be, for example, hydrocarbon groups having a chain-structure including unsaturated bonds of 1–6 carbon atoms such as allyl groups, and alkyl groups of 1–6 carbon atoms. The phenylene derivatives include divalent groups derived from diphenyl ether, divalent groups derived from bis-phenol A, divalent groups derived from bis-phenol F, and divalent groups derived from bis-phenol S.

The naphthalene derivatives means a divalent group derived from substitutional or unsubstitutional naphthalene. The substitutional naphthalene may be, for example, hydrocarbon groups having a chain-structure including unsaturated bonds of 1–6 carbon atoms such as allyl groups, and alkyl groups of 1–6 carbon atoms.

The biphenylene derivatives means a divalent group derived from substitutional or unsubstitutional biphenylene. The substitutional biphenylene may be, for example, hydrocarbon groups having a chain-structure including unsaturated bonds of 1–6 carbon atoms such as allyl groups, and alkyl groups of 1–6 carbon atoms.

The fluorene derivatives means a divalent group derived from substitutional or unsubstitutional fluorene. The substitutional fluorene may be, for example, hydrocarbon groups having a chain-structure including unsaturated bonds of 1–6 carbon atoms such as allyl groups, and alkyl groups of 1–6 carbon atoms.

The bis-phenol fluorene derivatives means a divalent group derived from substitutional or unsubstitutional bis-phenol fluorene. The substitutional bis-phenol fluorene may be, for example, hydrocarbon groups having a chain-structure including unsaturated bonds of 1–6 carbon atoms such as allyl groups, and alkyl groups of 1–6 carbon atoms.

The anthracene derivatives means a divalent group derived from substitutional or unsubstitutional anthracene. The substitutional anthracene may be, for example, hydrocarbon groups having a chain-structure including unsaturated bonds of 1–6 carbon atoms such as allyl groups, and alkyl groups of 1–6 carbon atoms.

The condensate represented in the above general formula (7) may, for example, be substances represented by the following formulae (8) through (18), but should not limited to those substances.

general formula (8)

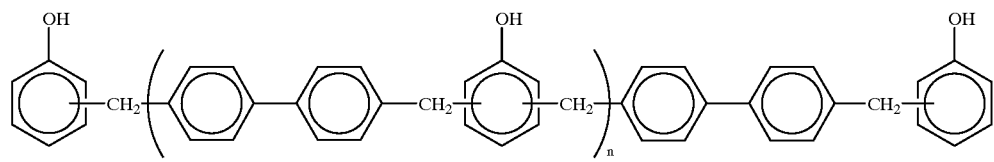

general formula (9)

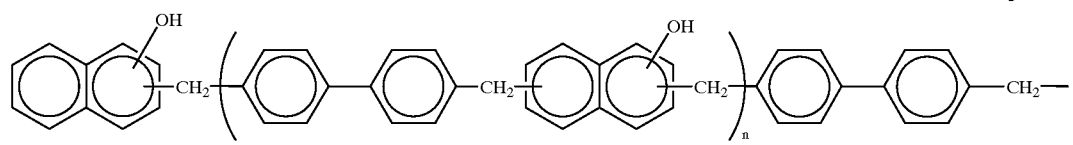

general formula (10)
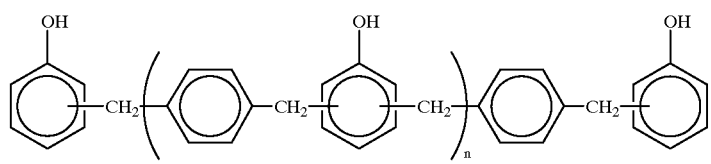
general formula (11)
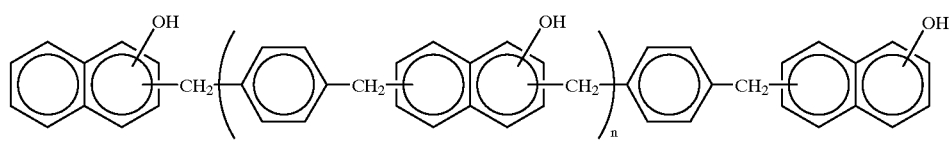
general formula (12)
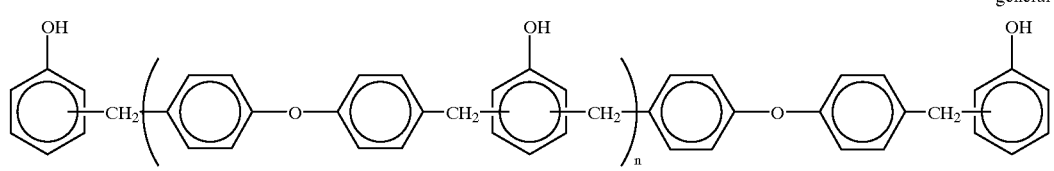
general formula (13)
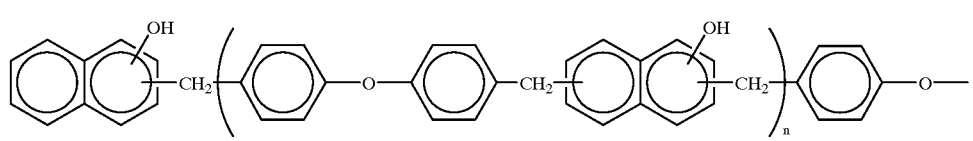
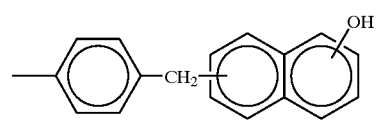
general formula (14)
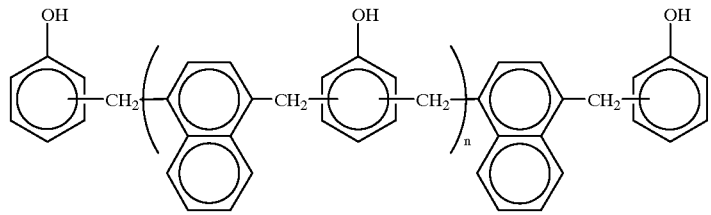
general formula (15)
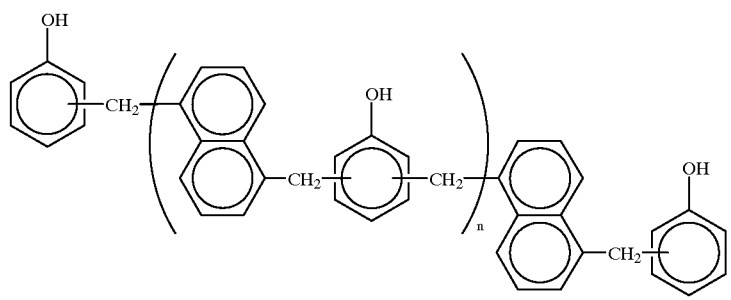
general formula (16a)
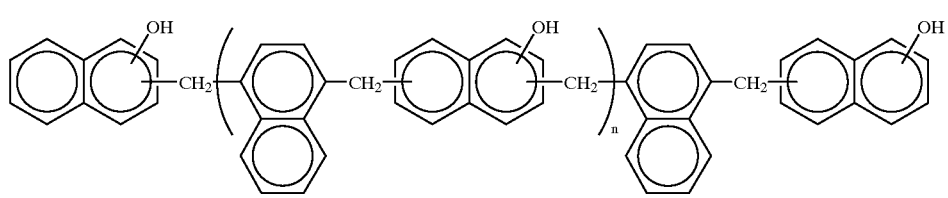

-continued

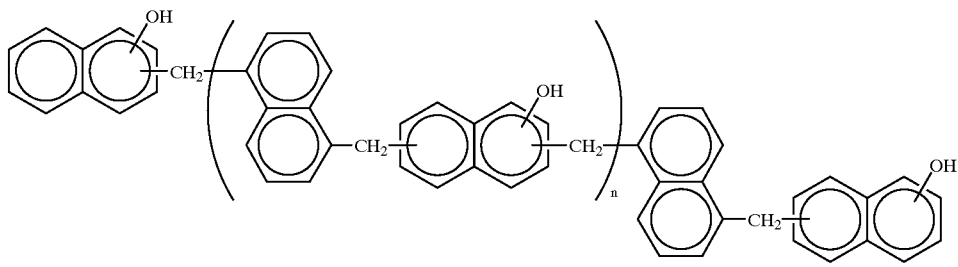

general formula (16b)

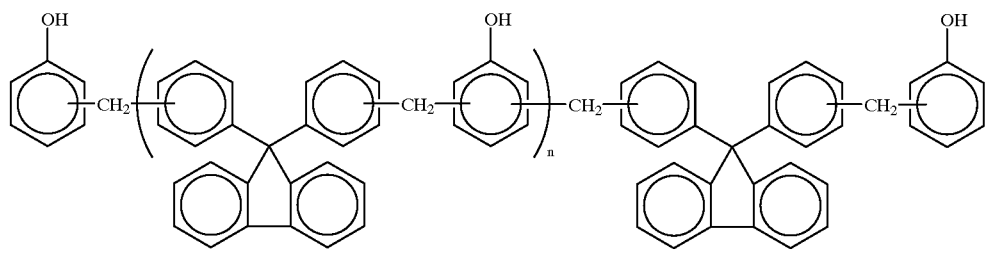

general formula (17)

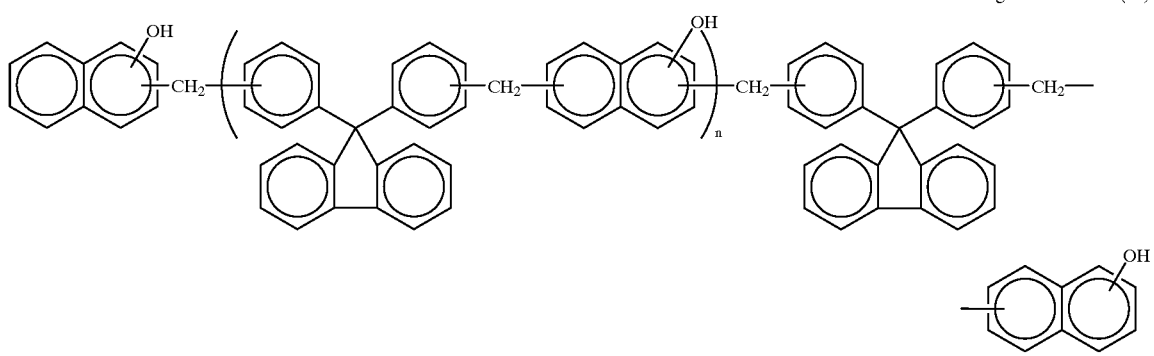

general formula (18)

In the above condensation reaction, acidic catalysts are used. Various types of the acidic catalysts may be used, for example, organic or inorganic acids such as p-toluenesulfonate, sulfuric acid, hydrochloric acid, oxalic acid, Lewis acids such as boron trifluroide, aluminum chloric anhydride, and zinc chloride, particularly, p-toluenesulfonate, sulfuric acid, hydrochloric acid are preferable. There is no limitation to the amount in use of those acidic catalyst but 0.1–30% by weight is preferable.

The above condensation reaction may be made in the absence of or in the presence of organic solvents. Available organic solvents may, for example, be methyl cellosolve, ethyl cellosolve, toluene, xylene, methylisobutylketone. The amount in use of the organic solvent is normally 50–300% by weight, preferably 100–250% by weight to a total weight of the source materials. A reaction temperature is normally 40–180° C. A reaction time is normally 1–10 hours. Those organic solvents may be used alone or in combination. A water and an alcohol generated during the reaction may preferably be removed by use of fractional distillation tube to promote the reaction.

After the reaction, a water cleaning treatment is carried out until a cleaning solution pH value becomes 3–7, preferably 5–7. For the water cleaning treatment, there may be used, as neutralization agents, basic substances, for example, alkali metal hydroxide such as sodium hydroxide and potassium hydroxide, alkali earth metal hydroxide such as calcium hydroxide and magnesium hydroxide, ammonia, sodium dihydrogenphosphate, and organic amines such as diethylene triamine, triethylene tetraamine, aniline and phenylene diamine. The water cleaning treatment may be carried out by the normal method. For example, the reaction mixture is added with a water solved with the above neutralization agents to repeat separating extraction operation.

After the neutralization treatment, the solvent and unreacted substances are removed under a low pressure at a heated condition to cause a condensation of the product to form a condensate represented by the above general formula (7).

The condensate typically represented by the above general formula (7), heterocyclic compound (C) having nitrogen as heteroatom and the aldehydes (D) are reacted under conditions of 4–10 pH, preferable 5–9 pH. The condensate typically represented by the above general formula (7) is condensed with the heterocyclic compound (C) having nitrogen as heteroatom via the aldehydes (D) to form a phenol condensate. This condensation reaction may be made with or without catalyst. The kinds of catalysts are not limited but basic catalyst is preferable.

The available basic catalysts may, for example, be alkali metal hydroxide such as sodium hydroxide and potassium hydroxide, alkali earth metal hydroxide such as barium hydroxide, and oxides of those alkali metal hydroxide and alkali earth metal hydroxide, ammonia, primary, secondary ternary amines, hexamethylenetetraamine, and sodium carbonate. If the phenol resin of the present invention is used as the thermosetting agent to the epoxy resin compositions for electric or electronic devices, it is preferable to use arnines to avoid that inorganic substances as metal resides as the residual catalyst.

There is no limitation to the sequences of the reactions. It is possible that the condensate represented by the above general formula (7) is reacted with the aldehydes (D) before the heterocyclic compound (C) having nitrogen as heteroatom is added thereto. It is also possible that the heterocyclic compound (C) having nitrogen as heteroatom is reacted with the aldehydes (D) before the condensate represented by the above general formula (7) is then added thereto. It is also possible that the condensate represented by the above general formula (7), the heterocyclic compound (C) and the aldehydes (D) are concurrently added to case the reaction. A molar ratio of the condensate represented by the above general formula (7) to the heterocyclic compound (C) and the aldehydes (D) is not limited but preferably 1:(0.1–10): (0.1–10), and more preferably 1:(0.2–5):(0.2–5).

In view of control the reaction, it is also possible the reaction is made in the presence of various solvents. There is no limitation to the kinds of the solvents but available solvents may, for example, be acetone, methyl ethylketone, toluene, xylene, methyl isobutylketone, ethyl acetate, ethyleneglycolmonomethylether, N,N'-dimethylformamide, methanol and ethanol. Those solvents may be used alone or in combination.

The neutralization and water cleaning may, if any be carried out to remove impurities such as salts. If, however, amines are used as the catalyst, there is no need to carry out these processes. After the reaction, unreacted substances and the used catalysts are removed by the normal methods such as distillation under atmospheric pressure or in vacuum. It is necessary to carry out a heat treatment at 120° C. for obtain the resin substantially free of unreacted aldehydes and methylol groups. A heat treatment at a temperature below 120° C. is incapable of complete disappearance of the methylol groups. The heat treatment at above 120° C. for a sufficient time period is capable of complete disappearance of the methylol groups. The heat treatment at above 150° C. is preferable. At this high temperature, a distillation may preferably be carried out in accordance with the method of obtaining the novolak resins together with heating the same.

The phenol condensate of the present invention is useable for the flame retardant of the resin composition or the thermosetting agent. Examples of the phenol condensate of the present invention are represented by the following general formulae (19) through (30).

general formula (19)

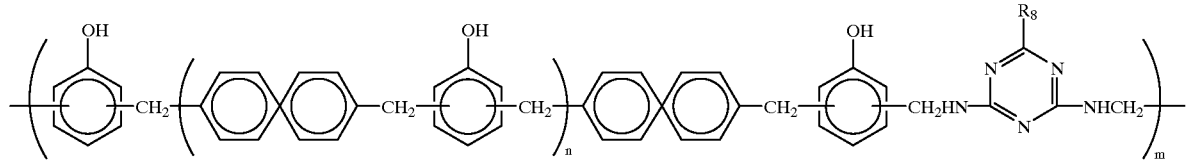

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (20)

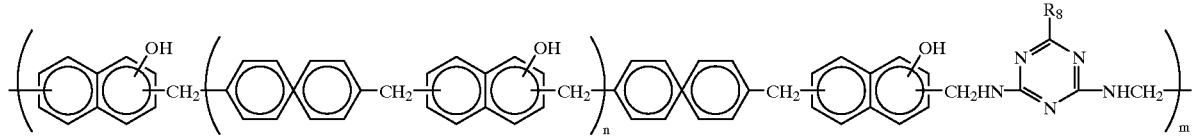

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (21)

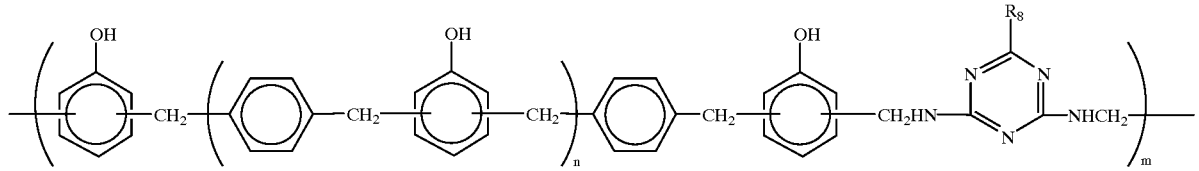

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (22)

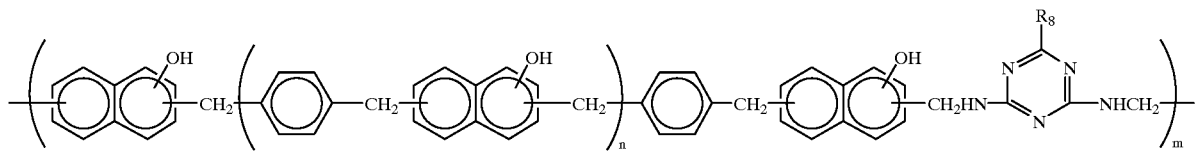

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (23)

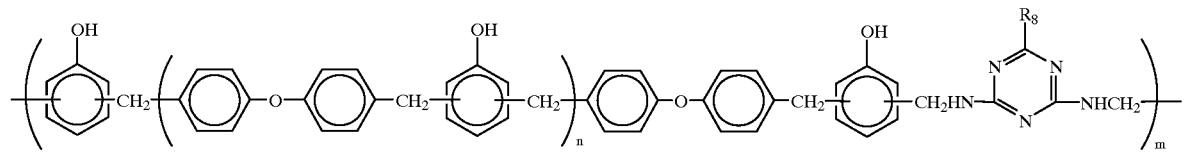

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (24)

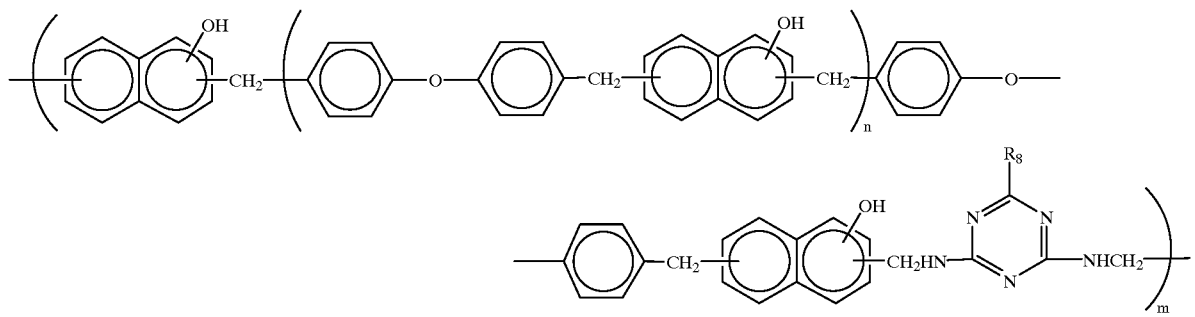

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

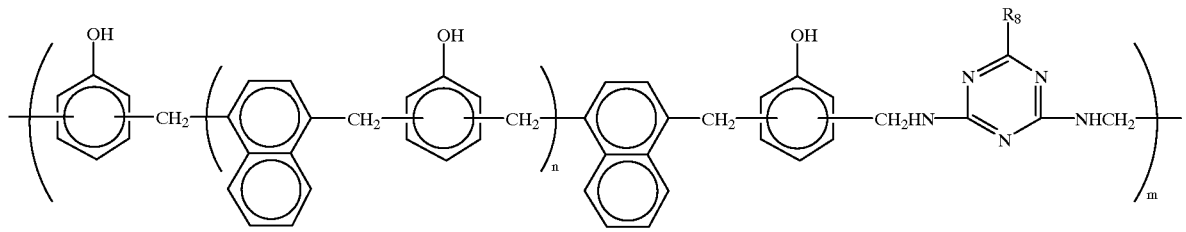

general formula (25)

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

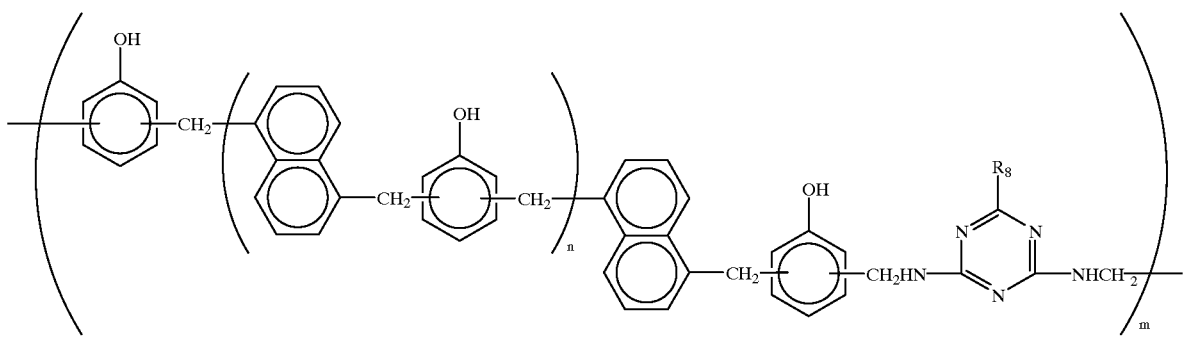

general formula (26)

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

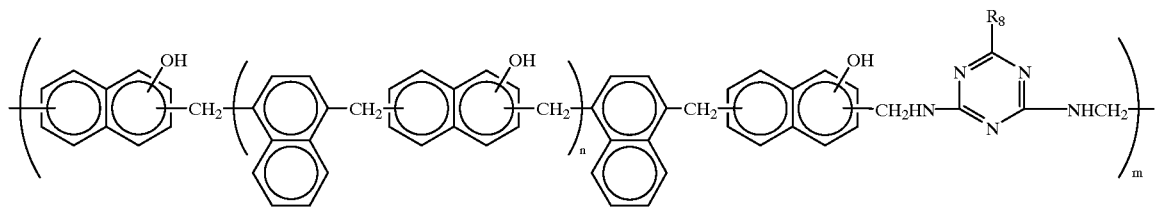

general formula (27)

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (28)

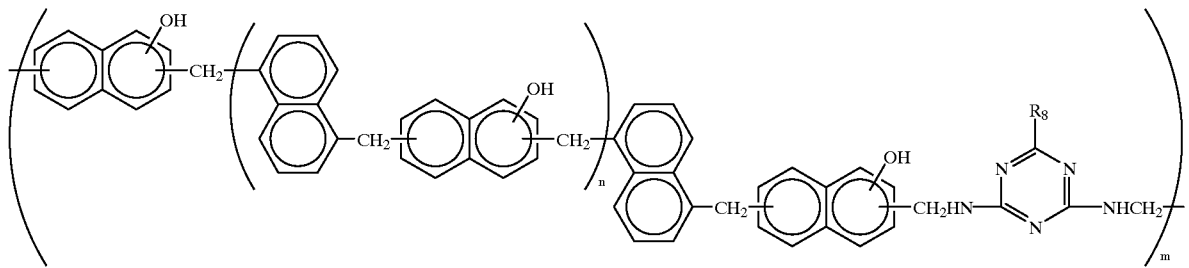

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (29)

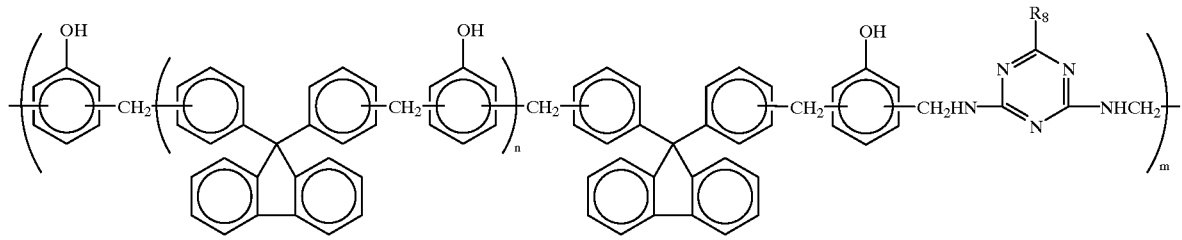

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (30)

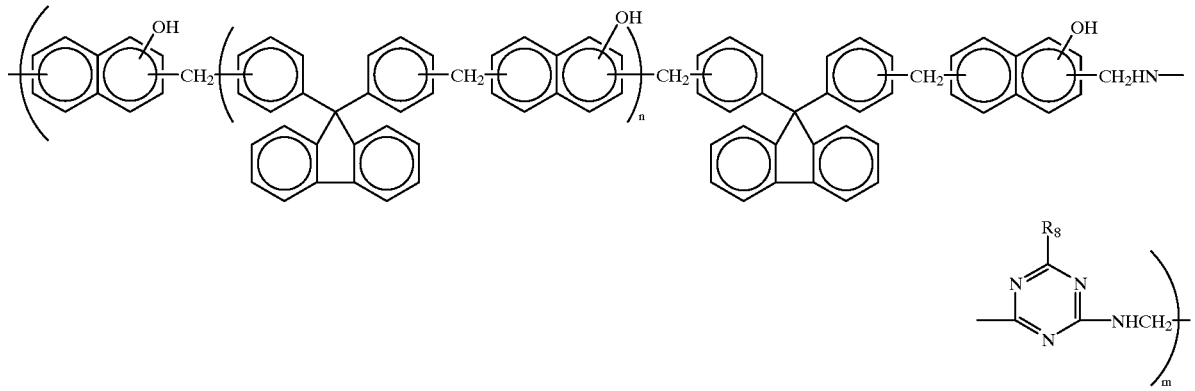

where R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

The flame retardant resin material including the phenol condensate may be used for the frame retardant to the resin composition or the thermosetting agent in combination with other phenol resins or amine compounds. The available phenol resins in combination are not limited but may, for example, be phenolbiphenylaralkyl resins, phenolphenylenearalkyl resins, phenoldiphenylaralkyl resins, naphthalene-containing phenol resins such as naphtholaralkyl resins, phenoltriazine resins, at least one or combination of biphenyl-4,4'-dihydroxyether, and 3,3',5,5'-tetramethyl biphenyl-4,4'-dihydroxyethr, tetraphenyrolethane, trisphenyrolethane, phenol novolak resins, cresol novolak resins, bis-phenol A resin, bis-phenol F resin, bis-phenol S resin, polyphenol resin, aliphatic ester phenol resin, cyclic aliphatic ester phenol resin, and ether ester phenol resin. Available amine compounds in combination are not limited but may, for example, be diamino diphenylmethane, diethylene triamine, and diaminodiphenylsulfone. Those phenol resins and the amine resins may be used alone or in combination. Phenolbiphenylaralkyl resins, phenolphenylenearalkyl resins, phenoldiphenylaralkyl resins, and naphtholaralkyl resins are particularly preferable.

The flame retardant epoxy resin material of the present invention will subsequently be described. The epoxy resin contained in the flame retardant epoxy resin material can be obtained by glycidyl-etherification of the phenol hydroxyl groups of the flame retardant phenol resin materials with use of any compounds which are not limited but allow glycidyl-etherification. For example, epihalohydrin such as epichlorohydrin. Glycidyl-etherification of substantially all parts of the phenolic hydroxyl groups makes it easy to produce the resin composition which is superior in thermal stability or thermal decomposition resistance and the moisture resistance. Other method than the glycidyl-etherification, for example, epoxidation to the phenolic hydroxyl group of the flame retardant resin material may be available by use of other compound including epoxy group.

In order for the glycidyl-etherification of the phenolic hydroxyl groups, it is possible that the phenol condensate is solved and mixed with an excess epihalohydrin such as epichlorohydrin and epibromehydrine and then an alkali metal hydroxide such as potassium hydroxide before and concurrently a reaction is caused at 20–120° C. for 1–10 hours.

The alkali metal hydroxide may be used in liquid state. In this case, the alkali metal hydroxide solution is continuously added into the reaction system and concurrently water and epihalohydrin are continuously removed under low pressure or atmospheric pressure prior to further separation to remove water whilst to return epihalohydrin to the reaction system.

A solution mixture of the phenol condensate and epihalohydrin may be added with a catalyst of quaternary ammonium salt such as tetramethylammoniumchloride, tetramethylammoniumbromide, and trimethylbenzylammoniumchloride for causing a reaction at 50–150° C. for 1–5 hours to obtain a halohydrin ether before a solid or a liquid of the alkali metal hydroxide is then added to cause a further reaction at 20–120° C., for 1–10 hours to form dehydrohalogenation. A molar ratio in use of the quaternary ammonium salt to hydroxyl groups of the phenol condensate of the present invention is normally 1–10 g, preferably 2–8 g.

Normally, a molar ratio in use of epihalohydrin to the hydroxyl groups of the phenol condensate of the present invention is normally 1–20 mol, preferably 2–10 mol. A molar ratio in use of alkali metal hydroxide to the hydroxyl groups of the phenol condensate of the present invention is normally 0.8–1.5 mol, preferably 0.9–1.1 mol. In order to promote the reaction, it is also possible to add alcohols such as methanol and ethanol, aprotic polar solvents dimethylsulfone and dimethylsulfoxide. An amount in use of alcohols to epihalohydrin is normally 2–20% by weight, preferably 4–15% by weight. An amount in use of aprotic polar solvents to epihalohydrin is normally 5–100% by weight, preferably 10–90% by weight.

Either after the reacted product of the glycidyl-etherification is cleaned with water or without water cleaning, epihalohydrin and the used solvents are removed at 110–250° C. under pressure of not higher than 10 mmHg. In order to obtain the epoxy resin with reduced hydrolytic halogen, the epoxy resin is dissolved into a solvent such as toluene and methylisobutylketone and then an alkali metal hydroxide such as sodium hydroxide and potassium hydroxide to cause a ring-closing reaction. In this case, a molar ratio in use of alkali metal hydroxide to the hydroxyl groups of the phenol condensate of the present invention used for the glycidyl-etherification is normally 0.01–0.3 mol, preferably 0.05–0.2 mol. A reaction temperature is normally 50–120° C., and the reaction time is 0.5–2 hours.

After the reaction, the salt is removed with filtration or water cleaning before the solvent such as toluene and isobutylketone is then removed to obtain the epoxy resin having the flame retardant epoxy resin material of the present invention.

Some examples of the above epoxy resins are represented by the following general formulae (31)–(42).

general formula (31)

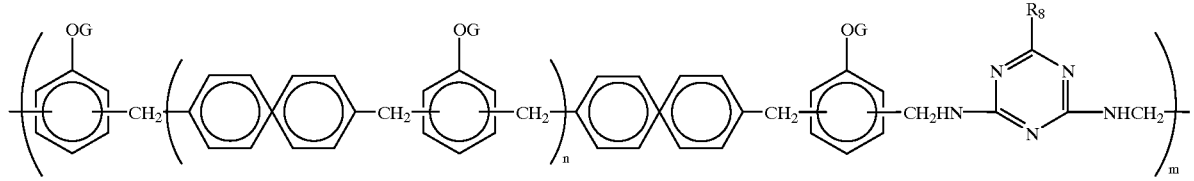

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (32)

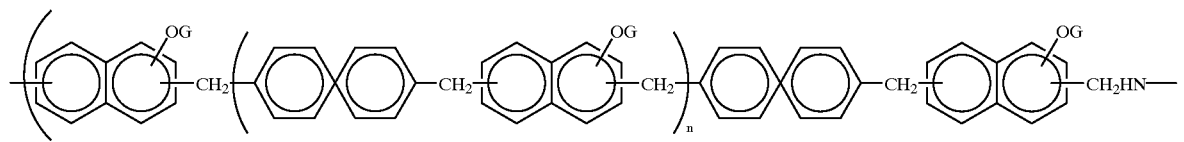

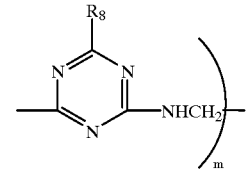

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (33)

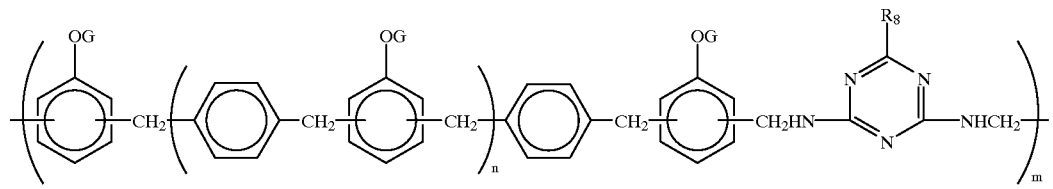

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (34)

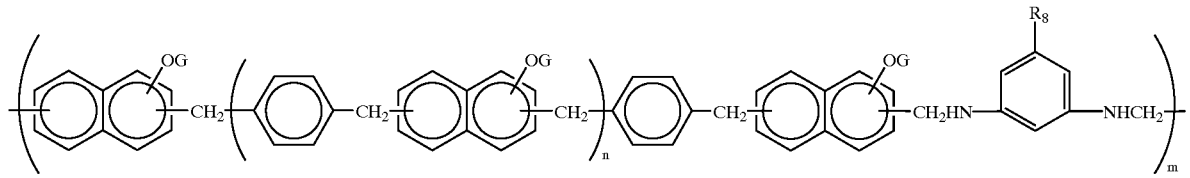

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (35)

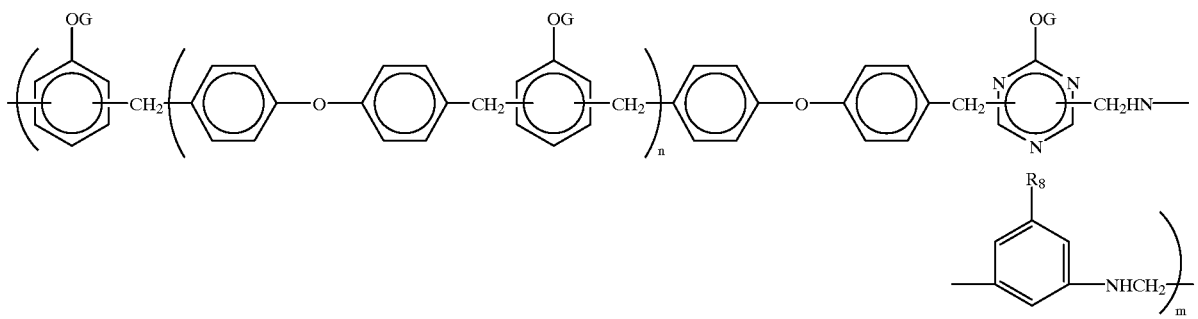

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (36)

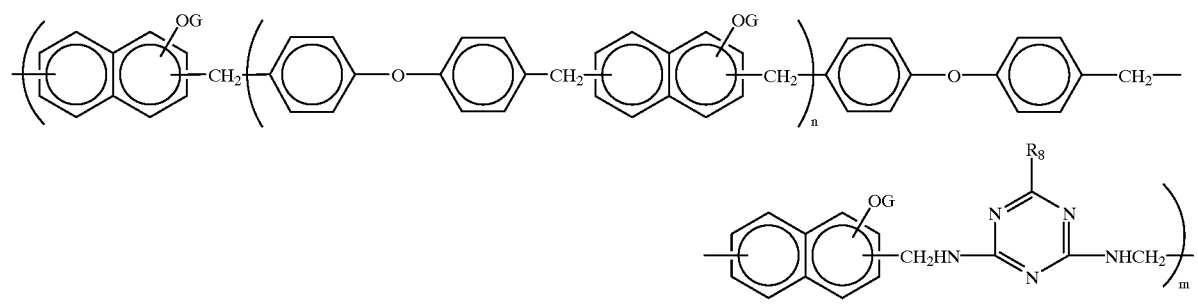

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0,0–3.0, more preferably 0.0–1.0, and "m" is 1.0–10, preferably 1.0–5.0, more preferably 1.0–2.0.

general formula (37)

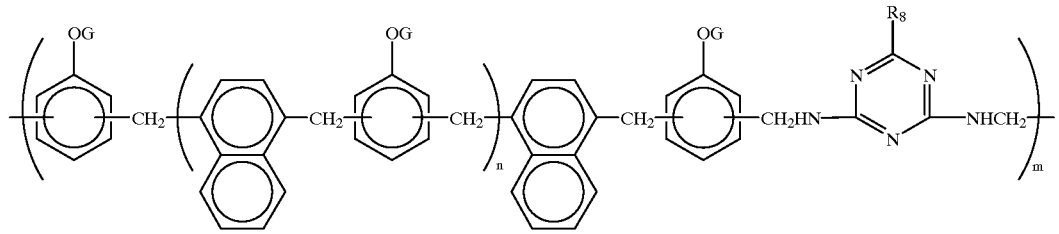

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (38)

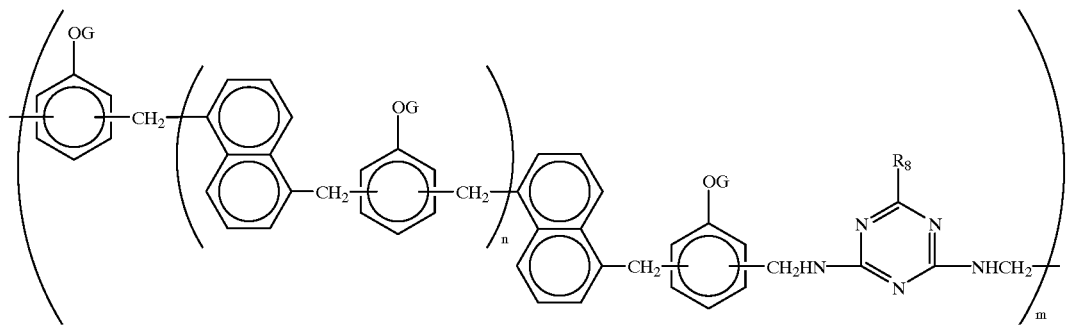

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (39)

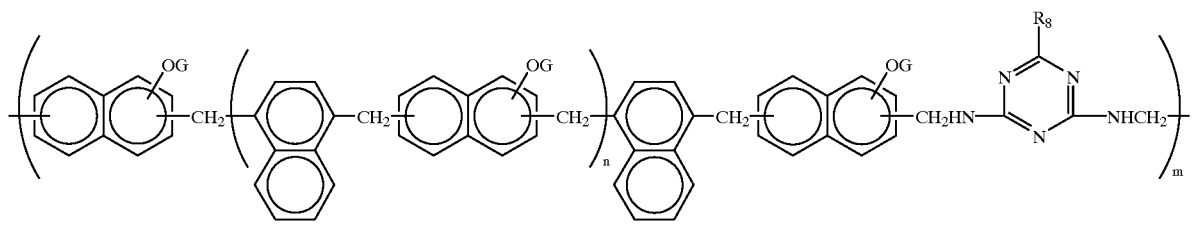

where G is glycidyl group, R8 is any one of phenyl groups, alkyl groups of 1–12 carbon atoms, amino groups, hydroxyl groups, hydroxylalkyl groups, other groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (40)

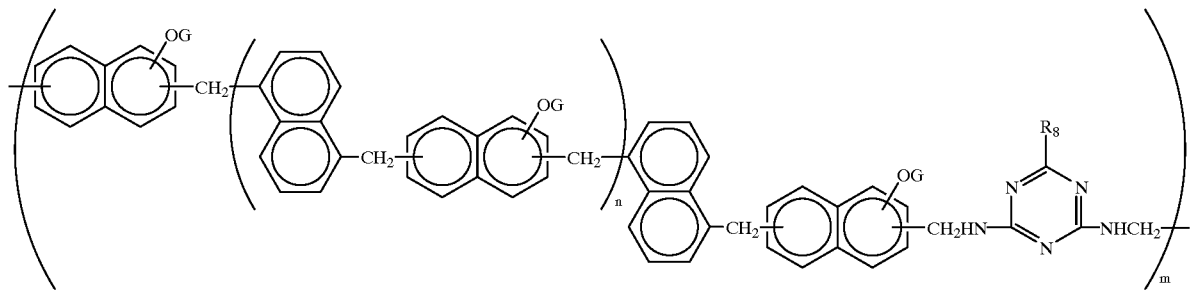

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (41)

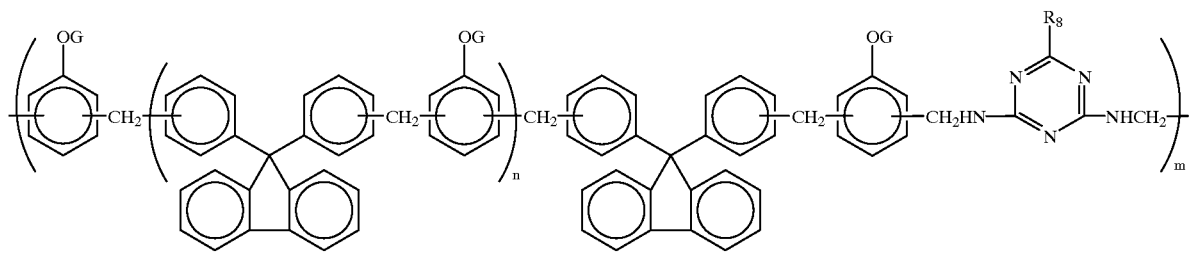

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

general formula (42)

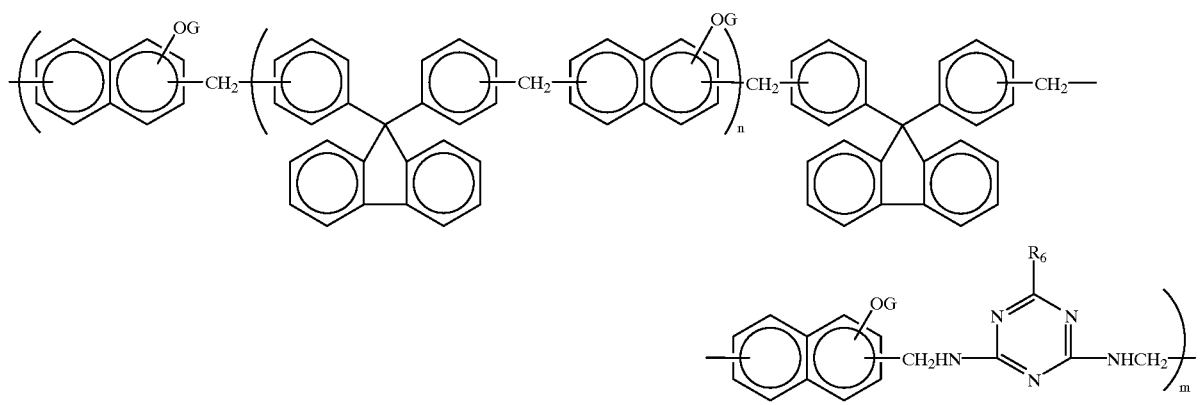

where G is glycidyl group, R8 is any one of phenyl groups, alkyl groups of 1–12 carbon atoms, amino groups, hydroxyl groups, hydroxylalkyl groups, ether groups, ester groups, carboxyl groups, unsaturated hydrocarbon groups, thiol groups, and cyano groups, and "n" is 0.0–10, preferably 0.0–3.0, more preferably 0.0–1.0, and "m" is 1.0–10, preferably 1.0–5.0, more preferably 1.0–2.0.

The flame retardant resin material including the epoxy resin may be used for the frame retardant to the resin composition or the base material of the epoxy resin composition in combination with other phenol resins or amine compounds. The available epoxy resins in combination are not limited but may, for example, be phenolbiphenylaralkyl epoxy resins, phenolphenylenearalkyl epoxy resins, phenoldiphenyletheraralkyl resins, naphthalene-containing epoxy resins such as naphtholaralkyl epoxy resins, phenoltriazine resins, phenolanthracenearalkyl epoxy resins, bisphenol fluorene epoxy resins, phenoltriazine epoxy resins, at least one or combination of biphenyl-4,4'-diglycidylether, and 3,3',5,5'-tetramethyl biphenyl-4,4'-diglycidylether, tetraphenyrolethane epoxy resins, trisphenyrolethane epoxy resins, phenol novolak epoxy resins, cresol novolak epoxy resins, bis-phenol A epoxy resin, bis-phenol F epoxy resin, bis-phenol S epoxy resin, polyphenol epoxy resin, aliphatic ester epoxy resin, cyclic aliphatic ester epoxy resin, and ether ester epoxy resin. Available amine compounds in combination are not limited but may, for example, be glycidyl amine compounds such as diamino diphenylmethane, diethylene triamine, and diaminodiphenylsulfone. Those epoxy resins may be used alone or in combination. Phenolbiphenylaralkyl epoxy resins, phenolphenylenearalkyl epoxy resins, phenoldiphenyletheraralkyl epoxy resins, and naphtholaralkyl epoxy resins are particularly preferable.

A weight-average molecular weight of the phenol condensate included in the flame retardant phenol resin material of the present invention is not limited but may, for example, be 300–10000. A weight-average molecular weight of the epoxy resin included in the flame retardant epoxy resin material of the present invention is not limited but may, for example, be 300–10000.

It is preferable that the flame retardant resin material of the present invention is substantially free of unreacted formaldehydes and methylol groups to improve mixing stability with the epoxy resin or thermosetting agent in use as the base material or thermosetting agent.

An unreacted unifunctional phenol monomer included in the flame retardant resin material of the present invention is preferably not more than 3% by weight in order to improve the mixing stability and particularly improve thermal stability and moisture resistance of the epoxy resin composition.

The unreacted unifunctional phenol monomer means a phenol monomer including only one phenolic hydroxyl group which may be reacted with epoxy groups.

The flame retardant resin composition of the present invention includes the flame retardant phenol resin material and/or the flame retardant epoxy resin material. It is possible to add those resin materials alone or in combination. It is also possible to prepare a mixture of flame retardant phenol resin material and the flame retardant epoxy resin material to add the mixture. It is also possible to prepare a mixture of flame retardant phenol resin material and the flame retardant epoxy resin material for subsequent semi-thermosetting and thermosetting the mixture and then grinding the same for adding the powders.

In accordance with the present invention, a total content (X) of the phenol condensate, and the epoxy resin obtained by the glycidyl-etherification of the phenol condensate is preferably in the range of 0.1% by weight to 45% by weight, particularly preferable 0.3% by weight to 30% by weight, where X=(b/a)100, "a" is a total weight of the resin component of the resin composition, "b" is a total weight of the phenol condensate and the epoxy resin obtained by the glycidyl-etherification of the phenol condensate.

If the total weight is less than 0.1% by weight, then an amount of flame reducing gas of nitrogen based gas is insufficient for reducing the fire or flame. If the total weight is less than 45% by weight, it is possible that the obtained flame retardancy is insufficient, and also possible that a concentration of the heterocyclic compound having nitrogen as heteroatom in the resin composition is so high as reducing the moisture resistance.

The epoxy resin and the thermosetting agent for the epoxy resin may be contained in the flame retardant resin composition of the present invention. A ratio (OH/Ep) of a total number (Ep) of epoxy groups in the epoxy resin to a total number (OH) of hydroxyl groups in the thermosetting agent is preferably in the range of 0.7 to 2.5 in order to improve the flame retardancy of the resin. If the ratio (OH/Ep) is less than 0.7, then a generated amount of a flammable component such as allylalcohol is increased due to residual epoxy resin residing on a bridge structure which has been formed by the thermosetting agent and the epoxy resin, thereby preventing improvement in the flame retardancy. If the ratio (OH/Ep) is more than 2.5, then the bridge density is too low to harden the epoxy resin composition, whereby the thermal stability and the solidity are insufficient.

The flame retardant resin composition of the present invention may optionally include various additives such as filler and hardening promoter.

Available fillers are not limited but may, for example, be fused silica powders, crystal silica powders, alumina powders, silicon nitride, glass fibers, carbon fibers, and aramid fibers or aromatic polyamide fibers. Those fillers may be used alone or in mixture.

Available hardening promoters may be promoters for hardening the epoxy resin and the hardening agent, for example, triphenyl phosphine, 2-methylimidazol, and 1,8-diazabicyclo(5,4,0)undecyne-7. Those hardening promoters may be used alone or in mixture.

Other available additives may, for example, be coloring materials such as carbon black, silane coupling agents such as γ-glycidexypropyl trimethoxysilane, low stress components such as silicone oils and silicone rubbers, natural waxes, synthetic waxes, higher fatty acids, and metal salts thereof, mold release agents such as paraffin. Further, if any, other flame retardants may be co-used which comprises at least one selected from the groups of phosphorus compounds such as red phosphorus and ester phosphate, metal hydroxide such as magnesium, aluminum, zinc, boron, calcium, nickel, cobalt, tin, copper, iron, and titanium.

The metal oxides may be co-used provided that the flame retardancy is improved by co-use of the metal oxide and the resin material. A composite metal hydroxide of the metal hydroxide and the metal oxide may be used to improve the flame retardancy. The necessary amount in addition of the above flame retardant is small because the flame retardant includes the flame retardant phenol resin martial and/or the flame retardant epoxy resin martial, whereby any deterioration in moisture resistance and other properties are suppressed.

The thermosetting resin composition including the flame retardant resin material of the present invention may be produced by previously admixing by ribbon blender or Henschel mixer and subsequent mixing with use of heating roller or kneader or subsequent dissolving the same into an organic solvent. After the organic solvent and moisture are if any removed before a transfer molding press or a heating press is used under predetermined conditions to heat the resin composition so as to cause a bridge reaction for hardening the resin composition, whereby the hard resin composition having a high flame retardancy can be obtained.

Semiconductor devices using the sealing material of the epoxy resin composition including the flame retardant resin material of the present invention are also superior in high flame retardancy, thermal stability or thermal decomposition resistance and moisture resistance. For example, a semiconductor device is mounted on a die pad of a lead frame for wire-bonding before sealing the semiconductor device with a resin composition including the flame retardant resin material of the present invention. The above epoxy resin composition may be applied to a lead on chip resin-sealed semiconductor device, and a ball grid array resin-sealed semiconductor device. The above epoxy resin composition may also be applied to the sealing resin for various types of electric and electronic devices including semiconductor devices.

The above epoxy resin composition including the flame retardant resin material of the present invention may be used as an insulator for a printed wiring board including glass fibers for improvements in flame retardancy, thermal stability or thermal decomposition resistance and moisture resistance. The above epoxy resin composition including the flame retardant resin material of the present invention may further be used as molding materials, cast materials, adhesives, coloring materials for improvements in flame retardancy, thermal stability or thermal decomposition resistance and moisture resistance.

The above thermoplastic resin composition including the flame retardant resin material of the present invention may be produced by extruders such as a uniaxial extruder, a biaxial extruder, a stone grinder type extruder. After the moisture is if any removed before an injection molding machine or a heating press is used under predetermined conditions to form the thermoplastic resin composition having a high flame retardancy.

Examples of the present invention and comparative examples will hereinafter be described, wherein a filler is used which comprises a molten spherical silica particles which has an average particle diameter of 16 micrometers and a specific surface area of 1.9 $m^2$/g measured by BET method, wherein particles having diameters of not less than 75 micrometers are 0.5% by weight.

Silane coupling agent is used which comprises N-phenyl-γ-aminopropyltrimethoxysilane (KBM573) which is commercially available from Shin-Etsu Chemical Industries Co.

EXAMPLE 1

A flask was attached with a temperature gage, a dripping funnel, a cooling tube, a fractionating column and a stirrer. 99 parts by weight (1.05 mol) of phenol and 121 parts by weight (0.5 mol) of a compound represented by the following general formula (43) were entered into the flask. At room temperature, a stirring is made with nitrogen blowing. 0.5 parts by weight (0.0026 mol) of p-toluene sulfonic acid (1-hydrate) was gradually added into the flask with attention to heat generation and without rising temperature of the solution to over 50° C. In oil bath, a heating was made to rise the temperature up to 120° C. so that, by use of the fractionating column, methanol was extracted before a reaction is allowed for 5 hours. After the reaction, 500 ml of methylisobutylketone was added and then an organic layer was transferred into a separating funnel for subsequent water cleaning which is continued until the cleaning solution becomes neutral. The used solvent and unreacted unifunctional phenol were removed from the organic layer with heating and under a low pressure, thereby obtaining a condensate (E) represented by the following formula (44).

general formula (43)

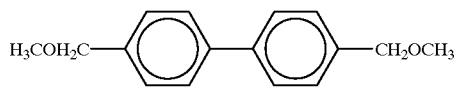

general formula (44)

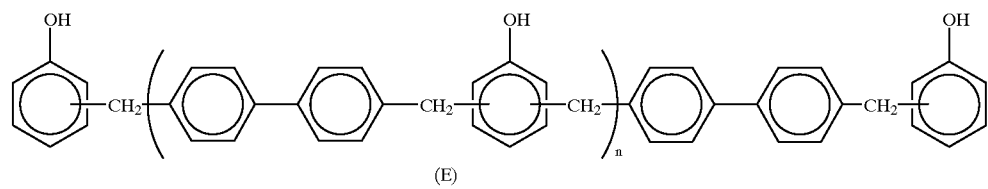

(E)

where "n" is 0.0 to 1.0.

EXAMPLE 2

81.3 parts by weight (0.22 mol) of the condensate (E) obtained in Example 1 was added with 26.4 parts by weight (0.22 mol) of melamine, 8.1 parts by weight (0.11 mol) of 41.5 wt. %-formaldehyde solution and 0.2 parts by weight (0.01 mol) of 25 wt. %-ammonium solution for gradually rising the temperature up to 100° C. with attention to heat generation. A reaction was made at 100° C. for 5 hours before further rising the temperature up to 180° C. for 2 hours under an atmospheric pressure with water removal. Subsequently, unreacted substances were then removed under a low pressure to obtain a phenol condensate (P1) having a nitrogen content of 8% by weight and a hydroxyl groups equivalent of 252 as well as having a softening point of 95° C. The obtained phenol condensate (P1) is represented in the following general formula (45).

general formula (45)

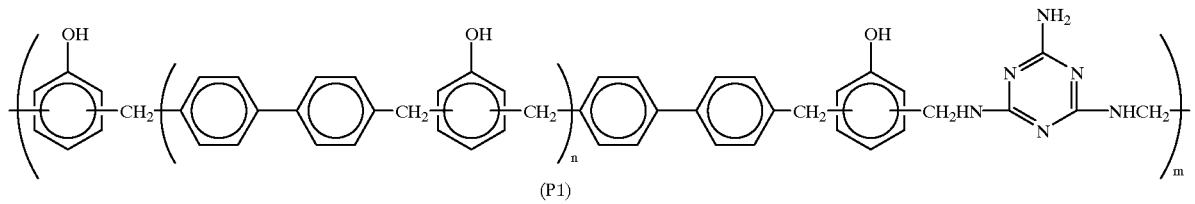

(P1)

where "n" is 0.0 to 1.0, and "m" is 1.0 to 2.0.

EXAMPLE 3

25 parts by weight (0.05 mol) of the phenol condensate (P1) obtained in Example 2 was added with 50 parts by weight (0.54 mol) of epichlorohydrin to rise the temperature up to 105° C. for dissolution thereof. Further, 20 parts by weight (0.1 mol) of 20 wt. %-sodium hydroxide solution was dropped for 3 hours for placing the solution statically for 30 minutes to cause a static separation before a lower layer or a water layer was removed.

Subsequently, the excess epichlorohydrin was distillated and recycled. 20 parts by weight (2 mol) of methylisobutylketone was added and dissolved. 0.5 parts by weight (0.0025 mol) of 20 wt. %-sodium hydroxide solution was added for placing the solution at 70° C. for 3 hours to cause a static separation before a lower layer or a water layer was removed. The reminder was then cleaned with 200 parts by weight of a distilled water. A volatile component was removed by distillation to obtain an epoxy resin (EP1) having a nitrogen content of 6% by weight and an epoxy equivalent of 308 as well as having a softening point of 75° C. and including hydrolytic chlorine of not more than 400 ppm. The obtained epoxy resin (EP1) is represented in the following general formula (46).

general formula (46)

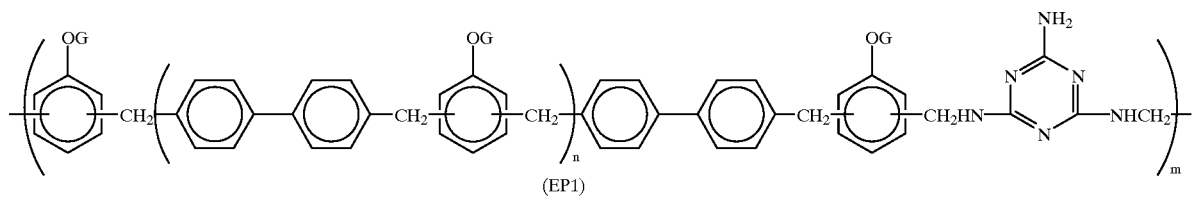

(EP1)

where "n" is 0.0 to 1.0, and "m" is 1.0 to 2.0.

EXAMPLE 4

A flask was attached with a temperature gage, a dripping funnel, a cooling tube, a fractionating column and a stirrer. 99 parts by weight (1.05 mol) of phenol and 83 parts by weight (0.5 mol) of a compound represented by the following general formula (47) were entered into the flask. At room temperature, a stirring is made with nitrogen blowing. 0.5 parts by weight (0.0026 mol) of p-toluene sulfonic acid (1-hydrate) was gradually added into the flask with attention to heat generation and without rising temperature of the solution to over 50° C. In oil bath, a heating was made to rise the temperature up to 120° C. so that, by use of the fractionating column, methanol was extracted before a reaction is allowed for 5 hours. After the reaction, 500 ml of methylisobutylketone was added and then an organic layer was transferred into a separating funnel for subsequent water cleaning which is continued until the cleaning solution becomes neutral. The used solvent and unreacted unifunctional phenol were removed from the organic layer with heating and under a low pressure, thereby obtaining a condensate (F) represented by the following formula (48).

general formula (47)

general formula (48)

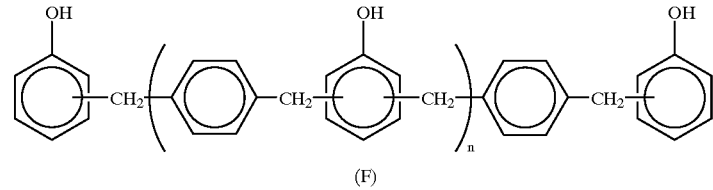

(F)

where "n" is 0.0 to 1.0.

EXAMPLE 5

63.8 parts by weight (0.22 mol) of the condensate (F) obtained in Example 4 was added with 26.4 parts by weight (0.22 mol) of melamine, 8.1 parts by weight (0.11 mol) of 41.5 wt. %-formaldehyde solution and 0.2 parts by weight (0.01 mol) of 25 wt. %-ammonium solution for gradually rising the temperature up to 100° C. with attention to heat generation. A reaction was made at 100° C. for 5 hours before further rising the temperature up to 180° C. for 2 hours under an atmospheric pressure with water removal. Subsequently, unreacted substances were then removed under a low pressure to obtain a phenol condensate (P2) having a nitrogen content of 8% by weight and a hydroxyl group equivalent of 245 as well as having a softening point of 92° C. The obtained phenol condensate (P2) is represented in the following general formula (49).

general formula (49)

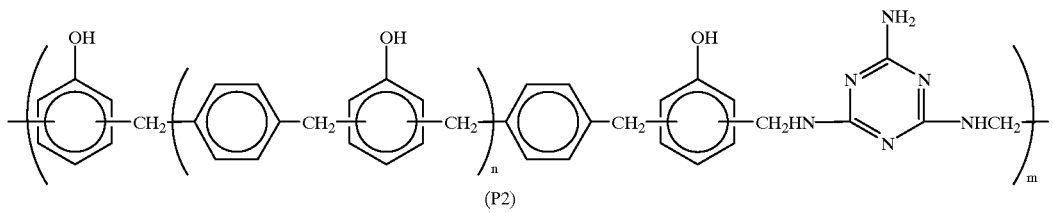

where "n" is 0.0 to 1.0, and "m" is 1.0 to 2.0.

EXAMPLE 6

25 parts by weight (0.05 mol) of the phenol condensate (P2) obtained in Example 5 was added with 50 parts by weight (0.54 mol) of epichlorohydrin to rise the temperature up to 105° C. for dissolution thereof. Further, 20 parts by weight (0.1 mol) of 20 wt. %-sodium hydroxide solution was dropped for 3 hours for placing the solution statically for 30 minutes to cause a static separation before a lower layer or a water layer was removed.

Subsequently, the excess epichlorohydrin was distillated and recycled. 20 parts by weight (1.2 mol) of methylisobutylketone was added and dissolved. 0.5 parts by weight (0.0025 mol) of 20 wt. %-sodium hydroxide solution was added for placing the solution at 70° C. for 3 hours to cause a static separation before a lower layer or a water layer was removed. The reminder was then cleaned with 200 parts by weight of a distilled water. A volatile component was removed by distillation to obtain an epoxy resin (EP2) having a nitrogen content of 6% by weight and an epoxy equivalent of 270 as well as having a softening point of 69° C. and including hydrolytic chlorine of not more than 400 ppm. The obtained epoxy resin (EP2) is represented in the following general formula (50).

general formula (50)

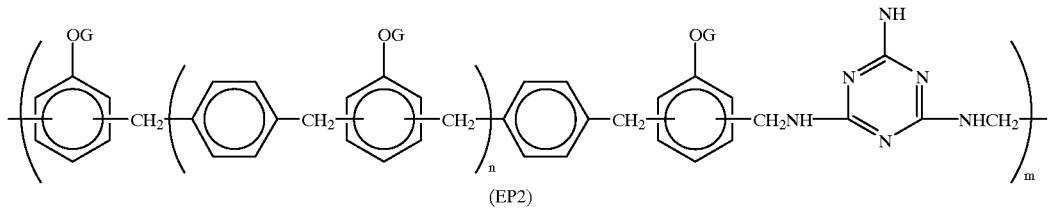

where G is glycidyl group, "n" is 0.0 to 1.0, and "m" is 1.0 to 2.0.

Epoxy resins and thermosetting agents used in the following examples and comparative examples are represented in the following general formulae (51) through (60) and thermoplastic resins used in the following examples and comparative examples are shown.

(Phenolbiphenylaralkyl Epoxy Resin (Epoxy Resin 1))

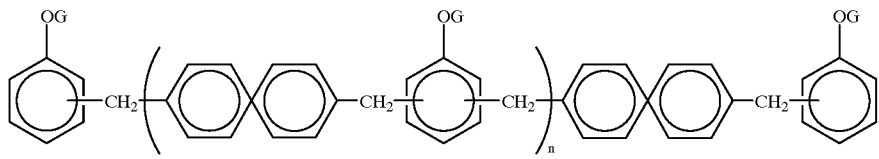

general formula (51)

where "G" is glycidyl groups, "n"=0.0 to 10, softening point is 57° C., epoxy equivalent is 270.

(Phenolbiphenylaralkyl Resin (Phenol Resin 1))

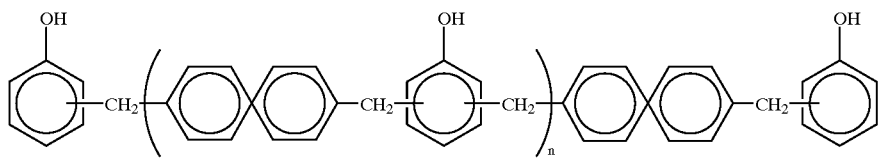

general formula (52)

where "n" 0.0 to 10, softening point is 120° C., hydroxyl group equivalent is 208.

(Phenolphenylenearalkyl Epoxy Resin (Epoxy Resin 2))

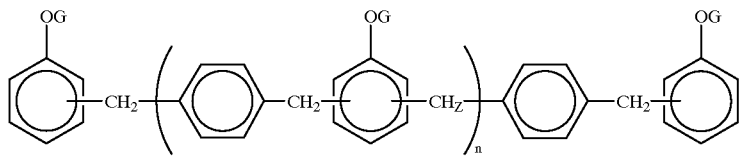

general formula (53)

where "G" is glycidyl groups, "n"=0.0 to 10, softening point is 55° C., epoxy equivalent is 238.

(Phenolphenylenearalkyl Resin (Phenol Resin 2))

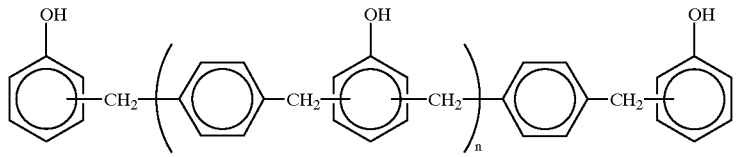

general formula (54)

where "n"=0.0 to 10, softening point is 83° C., hydroxyl group equivalent is 175.

(2-Functional Biphenyl Epoxy Resin (Epoxy Resin 3))

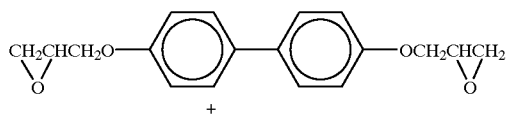

general formula (55)

+

-continued

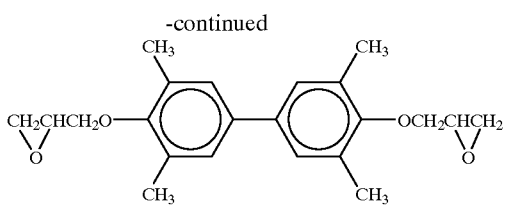

where melting point is 111° C., epoxy equivalent is 170.

(Cresol Novolak Epoxy Resin (Epoxy Resin 4))

general formula (56)

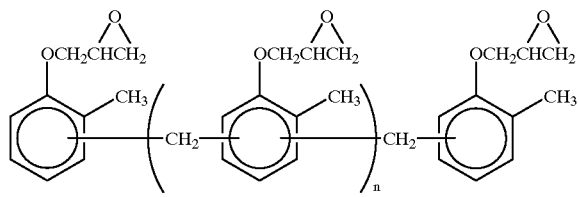

where "n"=0.0 to 10, softening point is 68° C., epoxy equivalent is 194.

(Phenoltriazine Epoxy Resin)

general formula (57)

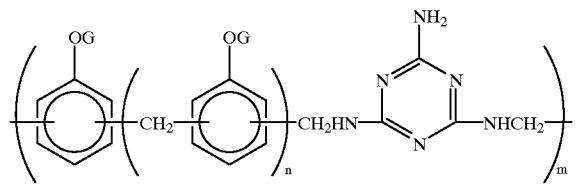

where "G" is glycidyl groups, "n"=0.0 to 10, "m"=1.0 to 10, softening point is 65° C., epoxy equivalent is 220, nitrogen content is 6% by weight.

(Phenoltriazine Resin)

general formula (58)

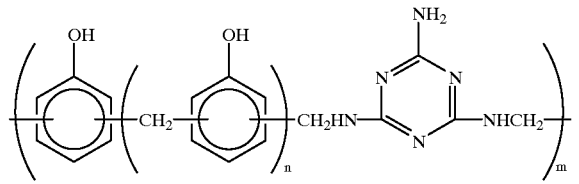

where "n"=0.0 to 10, "m"=1.0 to 10, softening point is 90° C., hydroxyl group equivalent is 124, nitrogen content is 8% by weight.

(Phenol Benzoguanamine Resin)

general formula (59)

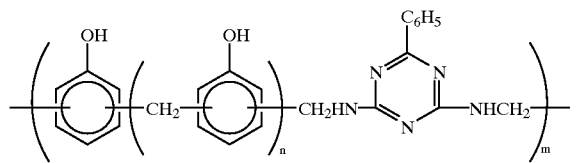

where "n"=0.0 to 10, "m"=1.0 to 10, softening point is 105° C., hydroxyl group equivalent is 220, nitrogen content is 19% by weight.

(Phenol Benzoguanamine Epoxy Resin)

general formula (60)

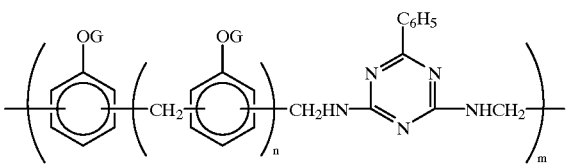

where "G" is glycidyl groups, "n"=0.0 to 10, "m"=1.0 to 10, softening point is 80° C., epoxy equivalent is 276, nitrogen content is 15% by weight.

(Thermoplastic Resin Composition 1)
acrylonitrile butadiene styrene copolymer: Sumitomo Chemical A &L GA-704, hereinafter referred to as "ABS".

(Thermoplastic Resin Composition 2)
polystyrene resin: Shin-Nitetsu Sumitomo Chemical H-65, hereinafter referred to as "PS".

EXAMPLE 7

At ordinary temperature, there were previously admixed 11.2 parts by weight of phenolbiphenylaralkyl epoxy resin (epoxy resin 1), 7.5 parts by weight of phenolbiphenylaralkyl resin (phenol resin 1), 1.4% by weight of the above phenol condensate (P1) obtained in Example 2, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

EXAMPLE 8

At ordinary temperature, there were previously admixed 10.0 parts by weight of phenolbiphenylaralkyl epoxy resin (epoxy resin 1), 8.7 parts by weight of phenolbiphenylaralkyl resin (phenol resin 1), 1.4% by weight of the above epoxy resin (EP1) obtained in Example 3, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

EXAMPLE 9

At ordinary temperature, there were previously admixed 5.99 parts by weight of phenolbiphenylaralkyl epoxy resin (epoxy resin 1), 4.94 parts by weight of pbenolbiphenylaralkyl resin (phenol resin 1), 1.17% by weight of the above phenol resin (P1) obtained in Example 2, 88.4% by weight of fused spherical silica powders, 0.2% by weight of carbon black, 0.1% by weight of silane coupling agent, 0.1% by weight of carnauba wax, 0.1% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C., for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

EXAMPLE 10

At ordinary temperature, there were previously admixed 11.2 parts by weight of phenolbiphenylaralkyl epoxy resin (epoxy resin 1), 7.5 parts by weight of phenolbiphenylaralkyl resin (phenol resin 1), 1.4% by weight of the above phenol condensate (P2), 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

EXAMPLE 11

At ordinary temperature, there were previously admixed 10.0 parts by weight of phenolbiphenylaralkyl epoxy resin (epoxy resin 1), 8.7 parts by weight of phenolbiphenylaralkyl resin (phenol resin 1), 1.4% by weight of the above epoxy resin (EP2), 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C., for 6 hours to form a flame retardant test sample plate.

EXAMPLE 12

At ordinary temperature, there were previously admixed 11.4 parts by weight of phenolphenylenearalkyl epoxy resin (epoxy resin 2), 7.3 parts by weight of phenolphenylenearalkyl resin (phenol resin 2), 1.4% by weight of the above phenol condensate (P2), 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

EXAMPLE 13

At a temperature of 220° C., on a stone grinding extruder, there were fused and admixed 10.0% by weight of the above phenol condensate (P1), 89.5% by weight of the above ABS (thermoplastic resin 1), 0.5% by weight of polytetrafluoroethylene (PTFE) to form a resin composition. This resin composition was dried at 120° C. for 3 hours before press-molding is carried out at 200° C. for 1 minute to form a flat plate having a thickness of 3.2 millimeters.

EXAMPLE 14

At a temperature of 220° C., on a stone grinding extruder, there were fused and admixed 10.0% by weight of the above phenol condensate (P1), 89.5% by weight of the above PS (thermoplastic resin 2), 0.5% by weight of polytetrafluoroethylene (PTFE) to form a resin composition. This resin composition was dried at 120° C. for 3 hours before press-molding is carried out at 200° C. for 1 minute to form a flat plate having a thickness of 3.2 millimeters.

The molded test plates obtained in Examples 7–14 were evaluated on flame retardancy, a boiled water absorption coefficient, a thermal stability and a moisture resistance.
Flame Retardancy Examination The sample plate has a size of 127 mm in length, 12.7 in width and 1.6 or 3.2 mm in thickness. The plate was held by a sample holder (clamp) so that a longitudinal direction of the plate is vertical to the ground. An opposite edge of the plate to the clamp was exposed to a flame by a burner for 10 seconds before the burner was made far from the plate so as to measure a after-flame time during which the flame resides on the plate after the burner had been made far from the plate (first after-flame time=F1). After the flame had disappeared, then the plate was again exposed to a flame by the burner for 10 seconds before the burner was made far from the plate so as to measure a after-flame time (second after-flame time=F2). This examination was made to five samples of each type of the plates for evaluation on the flame retardancy. There are four flame retardancy criterions.

Highest Criterion (UL94 V-0)

ΣF≦50 seconds (ΣF=total time of individual after-flame times of five plates)/Fmax≦10 seconds (Fmax=longest one of two after-flame times F1 and F2./No drip (drip=drip of a melt part of the plate due to flame)/Flame does not reach the clamp.

High Criterion (UL94 V-1)

ΣF≦250 seconds (ΣF=total time of individual after-flame times of five plates)/Fmax≦30 seconds (Fmax=longest one of two after-flame times F1 and F2./No drip (drip=drip of a melt part of the plate due to flame)/Flame does not reach the clamp.

Low Criterion (UL94 V-2)

ΣF≦250 seconds (ΣF=total time of individual after-flame times of five plates)/Fmax≦30 seconds (Fmax=longest one of two after-flame times F1 and F2./drip (drip=drip of a melt part of the plate due to flame)/Flame does not reach the clamp.

Lowest Criterion (UL94 V-2)

ΣF>250 seconds (ΣF=total time of individual after-flame times of five plates)/Fmax>30 seconds (Fmax=longest one of two after-flame times F1 and F2./Drip (drip=drip of a melt part of the plate due to flame)/Flame does reach the clamp.

Boiled Water Absorption coefficient Examination

The resin composition in Example 7 were formed in a disk-shape of 50 millimeters in diameter and 3 millimeters in thickness. The disk-shaped resin composition was dipped into a boiled water at 100° C. for 24 hours. The boiled water absorption coefficient (% by weight) was found on the basis of variation in weight of the disk-shaped resin composition between after and before the disk-shaped resin composition was dipped into the boiled water. Results of evaluations on the boiled water absorption coefficient are shown on below Table 1.

Thermal Stability (Thermal Decomposition Resistance) Examination

The plate of the flame retardation test of Example 7 was crushed to form 10 g of powders of 80 micrometers in powder size. The powder was heated at a temperature rising rate of 200° C./min in an air with a flow rate of 200 ml/min. When 5 wt. % reduction was confirmed, the temperature was measured. Results of evaluations on the thermal stability are shown on below Table 1.

Moisture Resistance Examination

A silicon chip of 3.0 millimeters in longitudinal length, 3.5 millimeters in horizontal length and 3.5 millimeters in thickness was prepared, wherein aluminum wirings with a width of 10 micrometers are provided at a pitch of 10 micrometers, and the aluminum wirings have expanding square parts of 70 micrometers squares on pads. The chip was mounted on a 16 pins DIP 42-aloy frame so that gold wirings of 20 micrometers were wire-bonded directly on the pads of the chip. Thereafter, the single plunger type transfer molding machine was used to seal the chip with the above tablet of Example 7 under conditions of previous heat temperature of 85° C., injection time of 15 seconds, injection pressure (effective pressure) of 100 kg/cm², molding temperature of 175° C., molding time of 120 seconds, thereby forming a 16 pins DIP type semiconductor device of 18 millimeters in longitudinal length, 5 millimeters in horizontal length and 3 millimeters in thickness. The semiconductor device was then subjected to the thermosetting process at 175° C. for 4 hours to form the moisture resistance test sample.

Tens of the above semiconductor device were subjected to a pressure cooker bias test (PCBT) under condition of 20 V voltage application. When open defective rate becomes 20% or two semiconductor devices become defective, the time was measured as index of the moisture resistance. Long defective generation time means high moisture resistance. Results of evaluations on the moisture resistance are shown on below Table 1.

TABLE 1

|  | Ex. 7 | Ex. 8 | Ex. 9 | Ex. 10 | Ex. 11 | Ex. 12 | Ex. 13 | Ex. 14 |
|---|---|---|---|---|---|---|---|---|
| phenolbiphenylaralkyl epoxy resin (epoxy resin 1) | 11.2 | 10.0 | 5.99 | 11.2 | 10 | — | — | — |
| phenolbiphenylaralkyl resin (phenol resin 1) | 7.5 | 8.7 | 4.94 | 7.5 | 8.7 | — | — | — |
| phenolphenylenearalkyl epoxy resin (epoxy resin 2) | — | — | — | — | — | 11.4 | — | — |
| phenolphenylenearalkyl resin (phenol resin 2) | — | — | — | — | — | 7.3 | — | — |
| 2-functional biphenyl epoxy resin (epoxy resin 3) | — | — | — | — | — | — | — | — |
| cresol novolak epoxy resin (epoxy resin 4) | — | — | — | — | — | — | — | — |
| phenolbiphenyltriazine epoxy resin (epoxy resin (PE1), N6 wt. %) | — | 1.4 (7.0/0.42) | — | — | — | — | — | — |
| phenolbiphenyltriazine resin (phenol condensate (P1), N8 wt. %) | 1.4 (7.0/0.56) | — | 0.17 (1.5/0.12) | — | — | — | 10.0 (10/0.8) | 10.0 (10/0.8) |
| phenolphenylenetriazine epoxy resin (epoxy resin (PE2), N6 wt. %) | — | — | — | — | 1.4 (7.0/0.42) | — | — | — |
| phenolphenylenetriazine resin (phenol condensate (P2), N8 wt. %) | — | — | — | 1.4 (7.0/0.56) | — | 1.4 (7.0/0.56) | — | — |
| phenolbiphenylbenzoguanamine epoxy resin (epoxy resin (PE3), N9 wt. %) | — | — | — | — | — | — | — | — |
| phenolbiphenylbenzoguanamine resin (phenol condensate (P3), N10 wt. %) | — | — | — | — | — | — | — | — |
| phenolphenylenebenzoguanamine epoxy resin (epoxy resin (PE4), N8 wt. %) | — | — | — | — | — | — | — | — |
| phenolphenylenebenzoguanamine resin (phenol condensate (P4), N10 wt. %) | — | — | — | — | — | — | — | — |
| phenoltriazine epoxy resin (N6 wt. %) phenoltriazine resin (N8 wt. %) | — | — | — | — | — | — | — | — |
| phenolbenzoguanamine epoxy resin (N15 wt. %) phenolbenzoguanamine resin (N19 wt. %) | — | — | — | — | — | — | — | — |

TABLE 1-continued

|  |  | Ex. 7 | Ex. 8 | Ex. 9 | Ex. 10 | Ex. 11 | Ex. 12 | Ex. 13 | Ex. 14 |
|---|---|---|---|---|---|---|---|---|---|
| ABS (thermoplastic resin 1) |  | — | — | — | — | — | — | 89.5 | — |
| PS (thermoplastic resin 2) |  | — | — | — | — | — | — | — | 89.5 |
| fused spherical silica |  | 79.0 | 79.0 | 88.4 | 79.0 | 79.0 | 79.0 | — | — |
| carbon black |  | 0.4 | 0.4 | 0.2 | 0.4 | 0.4 | 0.4 | — | — |
| silane coupling agent |  | 0.1 | 0.1 | 0.1 | 0.1 | 0.1 | 0.1 | — | — |
| carnauba wax |  | 0.2 | 0.2 | 0.1 | 0.2 | 0.2 | 0.2 | — | — |
| triphenylphosphine (T.P.P.) |  | 0.2 | 0.2 | 0.1 | 0.2 | 0.2 | 0.2 | — | — |
| polytetorafluoroethylene (PTFE) |  | — | — | — | — | — | — | 0.5 | 0.5 |
| UL94 criterion |  | V-0 | V-0 | V-0 | V-0 | V-0 | V-0 | V-1 | V-1 |
| (total time of after-flame times) |  | 7 | 9 | 20 | 15 | 18 | 19 | 105 | 130 |
| boiled water absorption coefficient per 24 hours | % by weight | 0.19 | 0.19 | 0.13 | 0.20 | 0.21 | 0.22 | unexamined | unexamined |
| thermal decomposition resistance (temperature at 5 wt. % reduction) | ° C. | 610 | 604 | 725 | 600 | 595 | 580 | unexamined | unexamined |
| moisture-resistance (time period for 20% defects) | Time | 450 | 450 | 470 | 440 | 440 | 430 | unexamined | unexamined |

(A/B):
A = percent by weight of the present resin to the total amount of resins.
B = percent by weight of nitrogen atoms to the total amount of resins.
X: Epoxy resin and phenol resin of the present invention

Comparative Example 1

At ordinary temperature, there were previously admixed 11.9 parts by weight of phenolbiphenylaralkyl epoxy resin (epoxy resin 1), 6.8 parts by weight of phenolbiphenylaralkyl resin (phenol resin 1), 1.4% by weight of phenoltriazine resin having nitrogen content of 8% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 2.

Comparative Example 2

At ordinary temperature, there were previously admixed 9.8 pans by weight of phenolbiphenylaralkyl epoxy resin (epoxy resin 1), 8.9 parts by weight of phenolbiphenylaralkyl resin (phenol resin 1), 1.4% by weight of phenoltriazine epoxy resin having nitrogen content of 6% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below able 2.

Comparative Example 3

At ordinary temperature, there were previously admixed 6.07 parts by weight of phenolbiphenylaralkyl epoxy resin (epoxy resin 1), 4.86 parts by weight of phenolbiphenylaralkyl resin (phenol resin 1), 0.17% by weight of phenoltriazine resin having nitrogen content of 8% by weight, 88.4% by weight of fused spherical silica powders, 0.2% by weight of carbon black, 0.1% by weight of silane coupling agent, 0.1% by weight of carnauba wax, 0.1% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 2.

Comparative Example 4

At ordinary temperature, there were previously admixed 6.0 parts by weight of phenolbiphenylaralkyl epoxy resin (epoxy resin 1), 5.1 parts by weight of phenolbiphenylaralkyl resin (phenol resin 1), 88.4% by weight of fused spherical silica powders, 0.2% by weight of carbon black, 0.1% by weight of silane coupling agent, 0.1% by weight of carnauba wax, 0.1% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 2.

Comparative Example 5

At ordinary temperature, there were previously admixed 11.9 parts by weight of phenolphenylenearalkyl epoxy resin (epoxy resin 2), 6.8 parts by weight of phenolphenylenearalkyl resin (phenol resin 2), 1.4% by weight of phenoltriazine resin having nitrogen content of 8% by weight, 79.0% by weight of fused spherical silica powders, 0.4% by weight of carbon black, 0.1% by weight of silane coupling agent, 0.1% by weight of carnauba wax, 0.1% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 2.

Comparative Example 6

At a temperature of 220° C., on a stone grinding extruder, there were fused and admixed 99.5% by weight of the above ABS (thermoplastic resin 1), 0.5% by weight of polytetrafluoroethylene (PTFE) to form a resin composition. This resin composition was dried at 120° C. for 3 hours before press-molding is carried out at 200° C. for 1 minute to form a flat plate having a thickness of 3.2 millimeters.

The molded test plates obtained in this comparative example was evaluated on flame retardancy, a boiled water absorption coefficient, a thermal stability and a moisture resistance. Results of evaluations on the moisture resistance are shown on below Table 2.

Comparative Example 7

At a temperature of 220° C., on a stone grinding extruder, there were fused and admixed 10.0% by weight of phenoltriazine resin having nitrogen content of 8% by weight, 89.5% by weight of the above ABS (thermoplastic resin 1), 0.5% by weight of polytetrafluoroethylene (PTFE) to form a resin composition. This resin composition was dried at 120° C. for 3 hours before press-molding is carried out at 200° C. for 1 minute to form a flat plate having a thickness of 3.2 millimeters.

The molded test plates obtained in this comparative example was evaluated on flame retardancy, a boiled water absorption coefficient, a thermal stability and a moisture resistance. Results of evaluations on the moisture resistance are shown on below Table 2.

Comparative Example 8

At a temperature of 220° C., on a stone grinding extruder, there were fused and admixed 99.5% by weight of the above PS (thermoplastic resin 2), 0.5% by weight of polytetrafluoroethylene (PTFE) to form a resin composition. This resin composition was dried at 120° C. for 3 hours before press-molding is carried out at 200° C. for 1 minute to form a flat plate having a thickness of 3.2 millimeters.

The molded test plates obtained in this comparative example was evaluated on flame retardancy, a boiled water absorption coefficient, a thermal stability and a moisture resistance. Results of evaluations on the moisture resistance are shown on below Table 2.

TABLE 2

|  | Com. Ex. 1 | Com. Ex. 2 | Com. Ex. 3 | Com. Ex. 4 | Com. Ex. 5 | Com. Ex. 6 | Com. Ex. 7 | Com. Ex. 8 |
| --- | --- | --- | --- | --- | --- | --- | --- | --- |
| phenolbiphenylaralkyl epoxy resin (epoxy resin 1) | 11.9 | 9.8 | 6.07 | 6.0 | — | — | — | — |
| phenolbiphenylaralkyl resin (phenol resin 1) | 6.8 | 8.9 | 4.86 | 5.1 | — | — | — | — |
| phenolphenylenearalkyl epoxy resin (epoxy resin 2) | — | — | — | — | 11.9 | — | — | — |
| phenolphenylenearalkyl resin (phenol resin 2) | — | — | — | — | 6.8 | — | — | — |
| 2-functional biphenyl epoxy resin (epoxy resin 3) | — | — | — | — | — | — | — | — |

TABLE 2-continued

|  | Com. Ex. 1 | Com. Ex. 2 | Com. Ex. 3 | Com. Ex. 4 | Com. Ex. 5 | Com. Ex. 6 | Com. Ex. 7 | Com. Ex. 8 |
|---|---|---|---|---|---|---|---|---|
| cresol nevolak epoxy resin (epoxy resin 4) | — | — | — | — | — | — | — | — |
| ※ phenolbiphenyltriazine epoxy resin (epoxy resin (PE1), N6 wt. %) | — | — | — | — | — | — | — | — |
| phenolbiphenyltriazine resin (phenol condensate (P1), N8 wt. %) | — | — | — | — | — | — | — | — |
| phenolphenylenetriazine epoxy resin (epoxy resin (PE2), N6 wt. %) | — | — | — | — | — | — | — | — |
| phenolphenylenetriazine resin (phenol condensate (P2), N8 wt. %) | — | — | — | — | — | — | — | — |
| phenolbiphenylbenzoguanamine epoxy resin (epoxy resin (PE3), N9 wt. %) | — | — | — | — | — | — | — | — |
| phenolbiphenylbenzoguanamine resin (phenol condensate (P3), N10 wt. %) | — | — | — | — | — | — | — | — |
| phenolphenylenebenzoguanamine epoxy resin (epoxy resin (PE4), N8 wt. %) | — | — | — | — | — | — | — | — |
| phenolphenylenebenzoguanamine resin (phenol condensate (P4), N10 wt. %) | — | — | — | — | — | — | — | — |
| phenoltriazine epoxy resin (N6 wt. %) | — | 1.4 (7.0/0.42) | — | — | — | — | — | — |
| phenoltriazine resin (N8 wt. %) | 1.4 (7.0/0.56) | — | 0.17 (1.5/0.12) | — | 1.4 (7.0/0.56) | — | 10.0 (10.0/0.8) | — |
| phenolbenzoguanamine epoxy resin (N15 wt. %) | — | — | — | — | — | — | — | — |
| phenolbenzoguanamine resin (N19 wt. %) | — | — | — | — | — | — | — | — |
| ABS (thermoplastic resin 1) | — | — | — | — | — | 99.5 | 89.5 | — |
| PS (thermoplastic resin 2) | — | — | — | — | — | — | — | 99.5 |
| fused spherical silica | 79.0 | 79.0 | 83.4 | 88.4 | 79.0 | — | — | — |
| carbon black | 0.4 | 0.4 | 0.2 | 0.2 | 0.4 | — | — | — |
| silane coupling agent | 0.1 | 0.1 | 0.1 | 0.1 | 0.1 | — | — | — |
| carnauba wax | 0.2 | 0.2 | 0.1 | 0.1 | 0.1 | — | — | — |
| triphenylphosphine (T.P.P.) | 0.2 | 0.2 | 0.1 | 0.1 | 0.1 | — | — | — |
| polytetorafluoroethylene (PTFE) | — | — | — | — | — | 0.5 | 0.5 | 0.5 |
| UL94 criterion | V-0 | V-0 | V-0 | V-0 | V-0 | NOT V-2 | V-1 | NOT V-2 |
| (total time of after-flame times) | 29 | 31 | 37 | 43 | 34 | >250 | 150 | >250 |
| boiled water absorption co-efficient per 24 hours  % by weight | 0.25 | 0.26 | 0.18 | 0.12 | 0.29 | unexamined | unexamined | unexamined |
| thermal decomposition resistance (temperature at 5 wt. % reduction) °C. | 563 | 550 | 570 | 680 | 545 | unexamined | unexamined | unexamined |
| moisture-resistance (time period for 20% defects) Time | 400 | 400 | 410 | 450 | 385 | unexamined | unexamined | unexamined |

(A/B):
A = percent by weight of the present resin to the total amount of resins.
B = percent by weight of nitrogen atoms to the total amount of resins.
※: Epoxy resin and phenol resin of the present invention

EXAMPLE 15

274.7 parts by weight (0.5 mol) of the condensate (E) obtained in Example 1 was added with 93.85 parts by weight (0.5 mol) of benzoguanamine, 52.7 parts by weight (0.65 mol) of 37 wt. %-formaldehyde solution and 0.879 parts by weight (0.015 mol) of 29 wt. %-ammonium solution for gradually rising the temperature up to 100° C. with attention to heat generation. A reaction was made at 100° C. for 5 hours before further rising the temperature up to 180° C. for 2 hours under an atmospheric pressure with water removal. Subsequently, unreacted substances were then removed under a low pressure to obtain a phenol condensate (P3) having a nitrogen content of 10% by weight and a hydroxyl groups equivalent of 260 as well as having a softening point of 120° C. The obtained phenol condensate (P3) is represented in the following general formula (61).

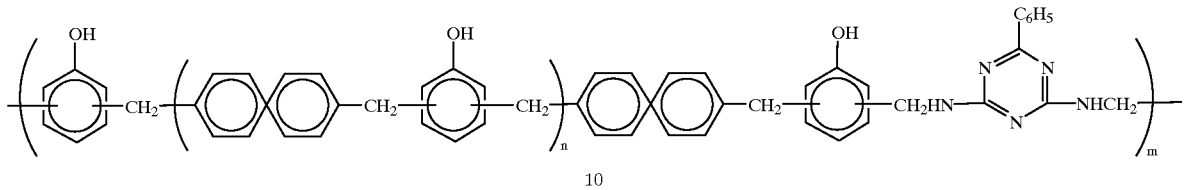

general formula (61)

where "n" is 0.0 to 1.0, and "m" is 1.0 to 2.0.

EXAMPLE 16

25 parts by weight (0.05 mol) of the phenol condensate (P3) obtained in Example 15 was added with 50 parts by weight (0.54 mol) of epichlorohydrin to rise the temperature up to 115° C. for dissolution thereof. Further, 20 parts by weight (0.1 mol) of 20 wt. %-sodium hydroxide solution was dropped for 3 hours for placing the solution statically for 30 minutes to cause a static separation before a lower layer or a water layer was removed.

Subsequently, the excess epichlorohydrin was distillated and recycled. 20 parts by weight (2mol) of methylisobutylketone was added and dissolved. 0.5 parts by weight (0.0025 mol) of 20 wt. %-sodium hydroxide solution was added for placing the solution at 70° C. for 3 hours to cause a static separation before a lower layer or a water layer was removed. The reminder was then cleaned with 200 parts by weight of a distilled water. A volatile component was removed by distillation to obtain an epoxy resin (EP3) having a nitrogen content of 9% by weight and an epoxy equivalent of 316 as well as having a softening point of 80° C. and including hydrolytic chlorine of not more than 400 ppm. The obtained epoxy resin (EP3) is represented in the following general formula (62).

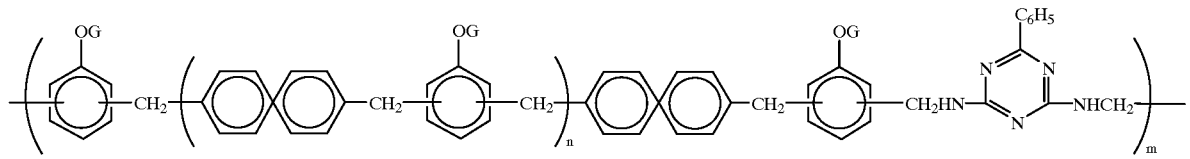

general formula (62)

where G is glycidyl group, "n" is 0.0 to 1.0, and "m" is 1.0 to 2.0.

EXAMPLE 17

403.4 parts by weight (0.5 mol) of the condensate (F) obtained in Example 4 was added with 93.85 parts by weight (0.5 mol) of benzoguanamine, 52.7 parts by weight (0.65 mol) of 37 wt. %-formaldehyde solution and 0.879 parts by weight (0.015 mol) of 29 wt. %-ammonium solution for gradually rising the temperature up to 100° C. with attention to heat generation. A reaction was made at 100° C. for 5 hours before further rising the temperature up to 180° C. for 2 hours under an atmospheric pressure with water removal. Subsequently, unreacted substances were then removed under a low pressure to obtain a phenol condensate (P4) having a nitrogen content of 10% by weight and a hydroxyl groups equivalent of 226 as well as having a softening point of 110° C. The obtained phenol condensate (P4) is represented in the following general formula (63).

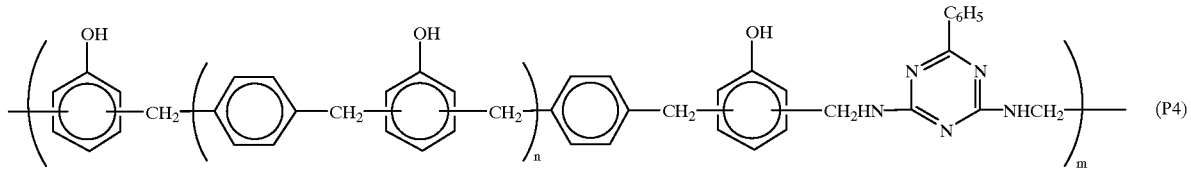

general formula (63)

(P4)

where "n" is 0.0 to 1.0, and "m" is 1.0 to 2.0.

EXAMPLE 18

25 parts by weight (0.05 mol) of the phenol condensate (P4) obtained in Example 17 was added with 50 parts by weight (0.54 mol) of epichlorohydrin to rise the temperature up to 115° C. for dissolution thereof. Further, 20 parts by weight (0.1 mol) of 20 wt. %-sodium hydroxide solution was dropped for 3 hours for placing the solution statically for 30 minutes to cause a static separation before a lower layer or a water layer was removed.

Subsequently, the excess epichlorohydrin was distillated and recycled. 20 parts by weight (1.2 mol) of methylisobutylketone was added and dissolved. 0.5 parts by weight (0.0025 mol) of 20 wt. %-sodium hydroxide solution was added for placing the solution at 70° C. or 3 hours to cause a static separation before a lower layer or a water layer was removed. The reminder was then cleaned with 200 parts by weight of a distilled water. A volatile component was removed by distillation to obtain an epoxy resin (EP4) having a nitrogen content of 8% by weight and an epoxy equivalent of 284 as well as having a softening point of 75° C. and including hydrolytic chlorine of not more than 400 ppm. The obtained epoxy resin (EP4) is represented in the following general formula (64).

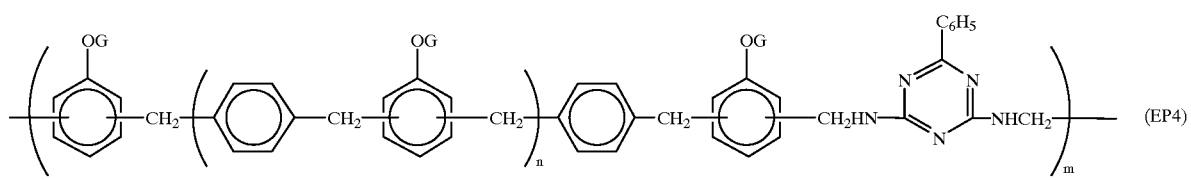

general formula (64)

where G is glycidyl group, "n" is 0.0 to 1.0, and "m" is 1.0 to 2.0.

EXAMPLE 19

At ordinary temperature, there were previously admixed 11.23 parts by weight of phenolbiphenylaralkyl epoxy resin (epoxy resin 1), 7.74 parts by weight of phenolbiphenylaralkyl resin (phenol resin 1), 1.13% by weight of the above phenol condensate (P3) having a nitrogen content of 10% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm², a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 20

At ordinary temperature, there were previously admixed 10.47 parts by weight of phenolbiphenylaralkyl epoxy resin (epoxy resin 1), 8.69 parts by weight of phenolbiphenylaralkyl resin (phenol resin 1), 0.94% by weight of the above epoxy resin (EP3) having a nitrogen content of 9% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm², a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 21

At ordinary temperature, there were previously admixed 10.32 parts by weight of phenolbiphenylaralkyl epoxy resin (epoxy resin 1), 8.72 parts by weight of phenolbiphenylaralkyl resin (phenol resin 1), 1.06% by weight of the above epoxy resin (EP4) having a nitrogen content of 8% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm², a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 22

At ordinary temperature, there were previously admixed 11.43 parts by weight of phenolphenylenearalkyl epoxy resin (epoxy resin 2), 7.54 parts by weight of phenolphenylenearalkyl resin (phenol resin 2), 1.13% by weight of the above phenol condensate (P4) having a nitrogen content of 10% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 23

At ordinary temperature, there were previously admixed 8.94 parts by weight of 2-functional biphenyl epoxy resin (epoxy resin 3), 10.03 parts by weight of phenolbiphenylaralkyl resin (phenol resin 1), 1.13% by weight of the above phenol condensate (P3) having a nitrogen content of 10% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 24

At ordinary temperature, there were previously admixed 5.62 parts by weight of phenolbiphenylaralkyl epoxy resin (epoxy resin 1), 3.86 parts by weight of phenolbiphenylaralkyl resin (phenol resin 1), 4.63 parts by weight of phenolphenylenearalkyl resin (phenol resin 2), 4.86 parts by weight of 2-functional biphenyl epoxy resin (epoxy resin 3), 1.13% by weight of the above phenol condensate (P3) having a nitrogen content of 10% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 25

At ordinary temperature, there were previously admixed 5.61 parts by weight of phenolbiphenylaralkyl epoxy resin (epoxy resin 1), 3.87 parts by weight of phenolbiphenylaralkyl resin (phenol resin 1), 4.30 pans by weight of phenolphenylenearalkyl resin (phenol resin 2), 5.19 parts by weight of cresol novolak epoxy resin (epoxy resin 4), 1.13% by weight of the above phenol condensate (P3) having a nitrogen content of 10% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 26

At a temperature of 220° C., on a stone grinding extruder, there were fused and admixed 8.0% by weight of the above phenol condensate (P3) having a nitrogen content of 10% by weight, 91.5% by weight of the above ABS (thermoplastic resin 1), 0.5% by weight of polytetrafluoroethylene (PTFE) to form a resin composition. This resin composition was dried at 120° C. for 3 hours before press-molding is carried out at 200° C. for 1 minute to form a flat plate having a thickness of 3.2 millimeters.

The molded test plates obtained in this comparative example was evaluated on flame retardancy, a boiled water absorption coefficient, a thermal stability and a moisture resistance. Results of evaluations on the moisture resistance are shown on below Table 3.

EXAMPLE 27

At a temperature of 220° C., on a stone grinding extruder, there were fused and admixed 8.0% by weight of the above phenol condensate (P3) having a nitrogen content of 10% by weight, 91.5% by weight of the above PS (thermoplastic resin 2), 0.5% by weight of polytetrafluoroethylene (PTFE) to form a resin composition. This resin composition was dried at 120° C. for 3 hours before press-molding is carried out at 200° C. for 1 minute to form a flat plate having a thickness of 3.2 millimeters.

The molded test plates obtained in this comparative example was evaluated on flame retardancy, a boiled water absorption coefficient, a thermal stability and a moisture resistance. Results of evaluations on the moisture resistance are shown on below Table 3.

TABLE 3

|  | Ex. 19 | Ex. 22 | Ex. 21 | Ex. 22 | Ex. 23 | Ex. 24 | Ex. 25 | Ex. 26 | Ex. 27 |
|---|---|---|---|---|---|---|---|---|---|
| phenolbiphenylaralkyl epoxy resin (epoxy resin 1) | 11.23 | 10.47 | 10.32 | — | — | 5.82 | 6.61 | — | — |
| phenolbiphenylaralkyl resin (phenol resin 1) | 7.74 | 8.69 | 8.72 | — | 10.03 | 3.86 | 3.87 | — | — |
| phenolphenylenearalkyl epoxy resin (epoxy resin 2) | — | — | — | 11.43 | — | — | — | — | — |
| phenolphenylenearalkyl resin (phenol resin 2) | — | — | — | 7.54 | — | 4.63 | 4.30 | — | — |
| 2-functional biphenyl epoxy resin (epoxy resin 3) | — | — | — | — | 8.94 | 4.86 | — | — | — |
| cresol nevolak epoxy resin (epoxy resin 4) | — | — | — | — | — | — | 5.19 | — | — |
| ※ phenolbiphenyltriazine epoxy resin (epoxy resin (PE1), N6 wt. %) | — | — | — | — | — | — | — | — | — |
| phenolbiphenyltriazine resin (phenol condensate (P1), N8 wt. %) | — | — | — | — | — | — | — | — | — |
| phenolphenylenetriazine epoxy resin (epoxy resin (PE2), N6 wt. %) | — | — | — | — | — | — | — | — | — |
| phenolphenylenetriazine resin (phenol condensate (P2), N8 wt. %) | — | — | — | — | — | — | — | — | — |
| phenolbiphenylbenzoguanamine epoxy resin (epoxy resin (PE3), N9 wt. %) | — | 0.94 (4.7/0.42) | — | — | — | — | — | — | — |
| phenolbiphenylbenzoguanamine resin (phenol condensate (P3), N10 wt. %) | 1.13 (5.6/0.56) | — | — | — | 1.13 (5.6/0.56) | 1.80 (5.6/0.54) | 1.13 (5.8/0.56) | 8.0 (8/0.8) | 8.0 (8/0.8) |
| phenolphenylenebenzoguanamine epoxy resin (epoxy resin (PE4), N8 wt. %) | — | — | 1.08 (5.3/0.42) | — | — | — | — | — | — |
| phenolphenylenebenzoguanamine resin (phenol condensate (P4), N10 wt. %) | — | — | — | 1.13 (5.0/0.58) | — | — | — | — | — |
| phenoltriazine epoxy resin (N6 wt. %) | — | — | — | — | — | — | — | — | — |
| phenoltriazine resin (N8 wt. %) | — | — | — | — | — | — | — | — | — |
| phenolbenzoguanamine epoxy resin (N15 wt. %) | — | — | — | — | — | — | — | — | — |
| phenolbenzoguanamine resin (N19 wt. %) | — | — | — | — | — | — | — | — | — |
| ABS (thermoplastic resin 1) | — | — | — | — | — | — | — | 91.5 | — |
| PS (thermoplastic resin 2) | — | — | — | — | — | — | — | — | 91.5 |
| fused spherical silica | 79.0 | 79.0 | 79.0 | 79.0 | 79.0 | 79.0 | 79.0 | — | — |
| carbon black | 0.4 | 0.4 | 0.4 | 0.4 | 0.4 | 0.4 | 0.4 | — | — |
| silane coupling agent | 0.1 | 0.1 | 0.1 | 0.1 | 0.1 | 0.1 | 0.1 | — | — |
| carnauba wax | 0.2 | 0.2 | 0.2 | 0.2 | 0.2 | 0.2 | 0.2 | — | — |
| triphenylphosphine (T.P.P.) | 0.2 | 0.2 | 0.2 | 0.2 | 0.2 | 0.2 | 0.2 | — | — |
| polytetorafluoroethylene (PTFE) | — | — | — | — | — | — | — | 0.5 | 0.5 |
| UL94 criterion | V-0 | V-0 | V-0 | V-0 | V-0 | V-0 | V-0 | V-1 | V-1 |
| (total time of after-flame times) | 3 | 5 | 12 | 14 | 24 | 11 | 10 | 90 | 110 |
| boiled water % by weight absorption coefficient per 24 hours | 0.16 | 0.15 | 0.19 | 0.20 | 0.22 | 0.20 | 0.14 | unexamined | unexamined |

TABLE 3-continued

|  |  | Ex. 19 | Ex. 22 | Ex. 21 | Ex. 22 | Ex. 23 | Ex. 24 | Ex. 25 | Ex. 26 | Ex. 27 |
| --- | --- | --- | --- | --- | --- | --- | --- | --- | --- | --- |
| thermal decomposition resistance (temperature at 5 wt. % reduction) | °C. | 630 | 620 | 610 | 595 | 600 | 595 | 825.0 | unexamined | unexamined |
| moisture-resistance (time period for 20% defects) | Time | 480 | 460 | 450 | 450 | 430 | 440 | 470.0 | unexamined | unexamined |

(A/B):
A = percent by weight of the present resin to the total amount of resins.
B = percent by weight of nitrogen atoms to the total amount of resins.
X: Epoxy resin and phenol resin of the present invention Comparative Example 9

At ordinary temperature, there were previously admixed 11.3 parts by weight of phenolbiphenylaralkyl epoxy resin (epoxy resin 1), 8.18 parts by weight of phenolbiphenylaralkyl resin (phenol resin 1), 0.59% by weight of phenol benzoguanamine resin having a nitrogen content of 19% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 4.

Comparative Example 10

At ordinary temperature, there were previously admixed 10.8 parts by weight of phenolbiphenylaralkyl epoxy resin (epoxy resin 1), 8.74 parts by weight of phenolbiphenylaralkyl resin (phenol resin 1), 0.56% by weight of phenol benzoguanamine epoxy resin having a nitrogen content of 15% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 4.

Comparative Example 11

At ordinary temperature, there were previously admixed 11.51 parts by weight of phenolphenylenearalkyl epoxy resin (epoxy resin 2), 8.00 parts by weight of phenolphenylenearalkyl resin (phenol resin 2), 0.59% by weight of phenol benzoguanamine resin having a nitrogen content of 19% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 4.

Comparative Example 12

At ordinary temperature, there were previously admixed 9.03 parts by weight of 2-functional biphenyl epoxy resin (epoxy resin 3), 10.48 parts by weight of phenolbiphenylaralkyl resin (phenol resin 1), 0.59% by weight of phenol benzoguanamine resin having a nitrogen content of 19% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 4.

Comparative Example 13

At ordinary temperature, there were previously admixed 5.72 parts by weight of phenolbiphenylaralkyl epoxy resin (epoxy resin 1), 4.30 parts by weight of phenolbiphenylaralkyl resin (phenol resin 1), 4.63 parts by weight of phenolphenylenearalkyl resin (phenol resin 2), 4.86 parts by weight of 2-functional biphenyl epoxy resin (epoxy resin 3), 0.59% by weight of phenol benzoguanamine resin having a nitrogen content of 19% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 4.

Comparative Example 14

At ordinary temperature, there were previously admixed 5.72 parts by weight of phenolbiphenylaralkyl epoxy resin (epoxy resin 1), 4.30 parts by weight of phenolbiphenylaralkyl resin (phenol resin 1), 4.30 parts by weight of phenolphenylenearalkyl resin (phenol resin 2), 5.19 parts by weight of cresol novolak epoxy resin (epoxy resin 4), 0.59% by weight of phenol benzoguanamine resin having a nitrogen content of 19% by weight, 79.0% by weight of fused spherical silica powders, 0.4% by weight of carbon black, 0.1% by weight of silane coupling agent, 0.2% by weight of carnauba wax, 0.2% by weight of triphenyl phosphine (T.T.P). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 4.

Comparative Example 15

At ordinary temperature, there were previously admixed 4.2% by weight of phenol benzoguanamine resin having a nitrogen content of 19% by weight, 95.3% by weight of the above PS (thermoplastic resin 2), 0.5% by weight of polytetrafluoroethylene (PTFE). Thereafter, the admixture was made on a roll of 100° C. for about 5 minutes and then the mixture was cooled and crushed to form the resin composition.

The resin composition was compressed to form a tablet. This tablet was previously heated at 85° C. for subsequent molding by use of a single plunger type transfer molding machine under conditions of an injection time of 15 seconds, an injection pressure (effective pressure) of 100 kg/cm$^2$, a molding temperature of 175° C., a molding time of 120 seconds in accordance with the UL94 flame retardation regulation. Subsequently, thermosetting process was carried out at 175° C. for 6 hours to form a flame retardant test sample plate.

The molded test plates obtained in this comparative example was evaluated on flame retardancy, a boiled water absorption coefficient, a thermal stability and a moisture resistance. Results of evaluations on the moisture resistance are shown on below Table 4.

TABLE 4

| | Com. Ex. 9 | Com. Ex. 10 | Com. Ex. 11 | Com. Ex. 12 | Com. Ex. 13 | Com. Ex. 14 | Com. Ex. 15 |
|---|---|---|---|---|---|---|---|
| phenolbiphenylaralkyl epoxy resin (epoxy resin 1) | 11.3 | 10.8 | — | — | 5.72 | 5.72 | — |
| phenolbiphenylaralkyl resin (phenol resin 1) | 8.18 | 8.74 | — | 10.48 | 4.30 | 4.30 | — |
| phenolphenylenearalkyl epoxy resin (epoxy resin 2) | — | — | 11.51 | — | — | — | — |
| phenolphenylenearalkyl resin (phenol resin 2) | — | — | 8.00 | — | 4.63 | 4.30 | — |
| 2-functional biphenyl epoxy resin (epoxy resin 3) | — | — | — | 9.03 | 4.86 | — | — |

TABLE 4-continued

|  |  | Com. Ex. 9 | Com. Ex. 10 | Com. Ex. 11 | Com. Ex. 12 | Com. Ex. 13 | Com. Ex. 14 | Com. Ex. 15 |
|---|---|---|---|---|---|---|---|---|
|  | cresol nevolak epoxy resin (epoxy resin 4) | — | — | — | — | — | 5.19 | — |
| ※ | phenolbiphenyltriazine epoxy resin (epoxy resin (PE1), N6 wt. %) | — | — | — | — | — | — | — |
|  | phenolbiphenyltriazine resin (phenol condensate (P1), N8 wt. %) | — | — | — | — | — | — | — |
|  | phenolphenylenetriazine epoxy resin (epoxy resin (PE2), N6 wt. %) | — | — | — | — | — | — | — |
|  | phenolphenylenetriazine resin (phenol condensate (P2), N8 wt. %) | — | — | — | — | — | — | — |
|  | phenolbiphenylbenzoguanamine epoxy resin (epoxy resin (PE3), N9 wt. %) | — | — | — | — | — | — | — |
|  | phenolbiphenylbenzoguanamine resin (phenol condensate (P3), N10 wt. %) | — | — | — | — | — | — | — |
|  | phenolphenylenebenzoguanamine epoxy resin (epoxy resin (PE4), N8 wt. %) | — | — | — | — | — | — | — |
|  | phenolphenylenebenzoguanamine resin (phenol condensate (P4), N10 wt. %) | — | — | — | — | — | — | — |
|  | phenoltriazine epoxy resin (N6 wt. %) | — | — | — | — | — | — | — |
|  | phenoltriazine resin (N8 wt. %) | — | — | — | — | — | — | — |
|  | phenolbenzoguanamine epoxy resin (N15 wt. %) | — | 0.56 (2.8/0.42) | — | — | — | — | — |
|  | phenolbenzoguanamine resin (N19 wt. %) | 0.59 (2.9/0.56) | — | 0.59 (2.9/0.56) | 0.59 (2.9/0.56) | 0.59 (2.9/0.56) | 0.59 (2.9/0.56) | 4.2 (4.2/0.8) |
|  | ABS (thermoplastic resin 1) | — | — | — | — | — | — | — |
|  | PS (thermoplastic resin 2) | — | — | — | — | — | — | 9.53 |
|  | fused spherical silica | 79.0 | 79.0 | 79.0 | 79.0 | 79.0 | 79.0 | — |
|  | carbon black | 0.4 | 0.4 | 0.4 | 0.4 | 0.4 | 0.4 | — |
|  | silane coupling agent | 0.1 | 0.1 | 0.1 | 0.1 | 0.1 | 0.1 | — |
|  | carnauba wax | 0.2 | 0.2 | 0.2 | 0.2 | 0.2 | 0.2 | — |
|  | triphenylphosphine (T.P.P.) | 0.2 | 0.2 | 0.2 | 0.2 | 0.2 | 0.2 | — |
|  | polytetorafluoroethylene (PTFE) | — | — | — | — | — | — | 0.5 |
|  | UL94 criterion | V-0 | V-0 | V-0 | V-0 | V-0 | V-0 | V-1 |
|  | (total time of after-flame times) | 26 | 28 | 30 | 44 | 31 | 30 | 180 |
|  | boiled water absorption coefficient per 24 hours  % by weight | 0.23 | 0.24 | 0.27 | 0.32 | 0.36 | 0.28 | unexamined |
|  | thermal decomposition resistance (temperature at 5 wt. % reduction)  ° C. | 565 | 558 | 555 | 550 | 540 | 560 | unexamined |
|  | moisture-resistance (time period for 20% defects)  Time | 410 | 410 | 395 | 380 | 380 | 400 | unexamined |

(A/B):
A = percent by weight of the present resin to the total amount of resins.
B = percent by weight of nitrogen atoms to the total amount of resins.
※: Epoxy resin and phenol resin of the present invention The novel resin compositions having the improved flame retardant resin materials in Examples 7, 8, 10, 11, 19–21 are superior in flame retardancy, thermal stability or thermal decomposition resistance, moisture resistance as compared to the conventional resin compositions having the conventional flame retardant resin materials in Comparative Examples 1, 2, 9, 10.

The novel resin composition having the improved flame retardant resin material in Example 9 is superior in flame retardancy, thermal stability or thermal decomposition resistance, moisture resistance as compared to the conventional resin compositions having the conventional flame retardant resin materials in Comparative Examples 3, 4.

The novel resin compositions having the improved flame retardant resin materials in Examples 12, 22 are superior in flame retardancy, thermal stability or thermal decomposition resistance, moisture resistance as compared to the conventional resin compositions having the conventional flame retardant resin materials in Comparative Examples 5, 11.

The novel resin composition having the improved flame retardant resin material in Example 23 is superior in flame retardancy, thermal stability or thermal decomposition resistance, moisture resistance as compared to the conventional resin composition having the conventional flame retardant resin material in Comparative Example 12.

The novel resin composition having the improved flame retardant resin material in Example 24 is superior in flame retardancy, thermal stability or thermal decomposition resistance, moisture resistance as compared to the conventional resin composition having the conventional flame retardant resin material in Comparative Example 13.

The novel resin composition having the improved flame retardant resin material in Example 25 is superior in flame retardancy, thermal stability or thermal decomposition resistance, moisture resistance as compared to the conventional resin composition having the conventional flame retardant resin material in Comparative Example 14.

The novel resin compositions having the improved flame retardant resin materials in Examples 13, 26 is superior in flame retardancy, thermal stability or thermal decomposition resistance, moisture resistance as compared to the conventional resin compositions having the conventional flame retardant resin materials in Comparative Examples 6, 7.

The novel resin compositions having the improved flame retardant resin materials in Examples 14, 27 is superior in flame retardancy, thermal stability or thermal decomposition resistance, moisture resistance as compared to the conventional resin compositions having the conventional flame retardant resin materials in Comparative Examples 8, 15.

The conventional resin compositions include the phenol resins having triazine rings on the molecular skeletons or include the epoxy resins having triazine rings on the molecular skeletons. The other conventional resin compositions include both phenolbiphenylaralkyl epoxy resins having biphenyl groups on the molecular skeletons and the phenol resins having triazine rings on the molecular skeletons. The novel resin compositions include the flame retardant resin compositions having both the triazine rings and the aromatic rings on the same molecular skeletons.

The novel resin compositions are superior in flame retardancy, thermal stability or thermal decomposition resistance and moisture resistance as compared to the conventional resin compositions.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A flame retardant phenol resin material which includes a phenol condensate, wherein a poly-aromatic compound obtained by a condensation reaction of phenols (A) to aromatics (B) except for phenols and a heterocyclic compound (C) including nitrogen as heteroatom are condensed via aldehydes (D), and wherein said aromatics (B) are represented by the following chemical formula (1),

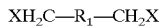　　　(1)

where $R_1$ is any one of biphenyl derivatives, phenylene derivatives, naphthalene derivatives, biphenylene derivatives, fluorene derivatives, bis-phenol fluorene derivatives, and X is any one of halogen atoms, hydroxyl groups and alkoxyl groups having not larger than 10 carbon atoms.

2. The flame retardant phenol resin material as claimed in claim 1, wherein said $R_1$ is any one of biphenyl derivatives and phenylene derivatives.

3. The flame retardant phenol resin material as claimed in claim 1, wherein said heterocyclic compound (C) is triazines.

4. The flame retardant phenol resin material as claimed in claim 3, wherein said triazines include compounds having at least one amino group.

5. The flame retardant phenol resin material as claimed in claim 3, wherein said triazines are at least one compound selected from the group consisting of melamine, acetoguanamine and benzoguanamine.

6. A flame retardant resin composition which includes at least a flame retardant phenol resin material as claimed in claim 1.

7. A semiconductor device having a sealing resin which comprises a flame retardant resin composition as claimed in claim 6.

8. A printed wiring board having an insulator which comprises a flame retardant resin composition as claimed in claim 6.

9. A molding material comprising a flame retardant resin composition as claimed in claim 6.

* * * * *